(12) United States Patent
Matsudo et al.

(10) Patent No.: US 8,986,494 B2
(45) Date of Patent: Mar. 24, 2015

(54) PLASMA PROCESSING APPARATUS AND TEMPERATURE MEASURING METHOD AND APPARATUS USED THEREIN

(75) Inventors: Tatsuo Matsudo, Nirasaki (JP); Chishlo Koshimizu, Nirasaki (JP); Jun Abe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 842 days.

(21) Appl. No.: 12/698,616

(22) Filed: Feb. 2, 2010

(65) Prior Publication Data

US 2010/0206482 A1 Aug. 19, 2010

Related U.S. Application Data

(60) Provisional application No. 61/220,682, filed on Jun. 26, 2009.

(30) Foreign Application Priority Data

Feb. 2, 2009 (JP) .................................. 2009-021205
Mar. 25, 2009 (JP) .................................. 2009-074603

(51) Int. Cl.
*C23C 16/00* (2006.01)
*G01J 5/08* (2006.01)
(Continued)

(52) U.S. Cl.
CPC ......... *H01L 21/67248* (2013.01); *G01J 5/0003* (2013.01); *G01J 5/0007* (2013.01);
(Continued)

(58) Field of Classification Search
CPC H01L 21/37248; G01J 5/0003; G01J 5/0007; G01J 5/0846

USPC .............. 156/345.27; 118/712, 666; 374/130, 374/131
See application file for complete search history.

(56) References Cited

U.S. PATENT DOCUMENTS 5,004,913 A * 4/1991 Kleinerman ............. 250/227.21
5,209,182 A * 5/1993 Ohta et al. .................... 118/666
(Continued)

FOREIGN PATENT DOCUMENTS

JP 02039525 A * 2/1990
JP 03232968 A * 10/1991
(Continued)

OTHER PUBLICATIONS

"The Wave Guide, Modes and Evanescent Tails". Canadian Instrumentation and Research Ltd. Oct. 2006.*
(Continued)

*Primary Examiner* — Jeffrie R Lund
*Assistant Examiner* — Yuechuan Yu
(74) *Attorney, Agent, or Firm* — Rothwell, Figg, Ernst & Manbeck, P.C.

(57) ABSTRACT

A plasma processing apparatus includes a temperature measuring unit; airtightly sealed temperature measuring windows provided in a mounting table, for optically communicating to transmit a measurement beam through a top surface and a bottom surface of the mounting table; and one or more connection members for connecting the mounting table and a base plate, which is provided in a space between the mounting table and the base plate. In the plasma processing apparatus, a space above the mounting table is set to be maintained under a vacuum atmosphere, and a space between the mounting table and the base plate is set to be maintained under a normal pressure atmosphere, and each collimator is fixed to the base plate at a position corresponding to each temperature measuring window, thereby measuring a temperature of the substrate via the temperature measuring windows by the temperature measuring unit.

9 Claims, 24 Drawing Sheets

(51) Int. Cl.
*H01L 21/67* (2006.01)
*G01J 5/00* (2006.01)
*G01J 5/04* (2006.01)
*G01K 11/00* (2006.01)

(52) U.S. Cl.
CPC ............... *G01J 5/041* (2013.01); *G01J 5/045* (2013.01); *G01J 5/048* (2013.01); *G01J 5/08* (2013.01); *G01J 5/0803* (2013.01); *G01J 5/0806* (2013.01); *G01J 5/0821* (2013.01); *G01J 5/0846* (2013.01); *G01K 11/00* (2013.01); *H01J 2237/2001* (2013.01)
USPC ...... 156/345.27; 118/712; 118/666; 374/130; 374/131

(56) References Cited

U.S. PATENT DOCUMENTS

| | | | |
|---|---|---|---|
| 5,322,361 A * | 6/1994 | Cabib et al. | 374/161 |
| 5,707,500 A * | 1/1998 | Shimamura et al. | 204/298.03 |
| 5,728,254 A * | 3/1998 | Jeng | 156/345.51 |
| 5,782,974 A * | 7/1998 | Sorensen et al. | 117/82 |
| 6,171,641 B1 * | 1/2001 | Okamoto et al. | 427/8 |
| 6,375,349 B1 * | 4/2002 | Gaal et al. | 374/44 |
| 7,355,715 B2 | 4/2008 | Suzuki et al. | |
| 2003/0056901 A1 * | 3/2003 | Nakano et al. | 156/345.47 |
| 2004/0108066 A1 * | 6/2004 | Hayami et al. | 156/345.27 |
| 2005/0271116 A1 | 12/2005 | Ito et al. | |
| 2006/0077394 A1 * | 4/2006 | Suzuki et al. | 356/479 |
| 2006/0152734 A1 * | 7/2006 | Suzuki et al. | 356/479 |
| 2006/0176490 A1 | 8/2006 | Suzuki et al. | |
| 2007/0009010 A1 * | 1/2007 | Shio et al. | 374/161 |
| 2007/0084847 A1 | 4/2007 | Koshimizu et al. | |
| 2007/0127034 A1 | 6/2007 | Koshimizu et al. | |
| 2008/0023147 A1 * | 1/2008 | Yokogawa et al. | 156/345.53 |
| 2008/0025370 A1 * | 1/2008 | Lohokare | 374/160 |
| 2008/0218744 A1 | 9/2008 | Abe et al. | |
| 2008/0236747 A1 | 10/2008 | Matsudo et al. | |
| 2008/0304543 A1 | 12/2008 | Abe et al. | |
| 2009/0228234 A1 | 9/2009 | Abe et al. | |

FOREIGN PATENT DOCUMENTS

| | | | |
|---|---|---|---|
| JP | 05160246 A * | 6/1993 | |
| JP | 05295543 A * | 11/1993 | |
| JP | 7-127625 A | 5/1995 | |
| JP | H8-17842 * | 1/1996 | |
| JP | 08162415 A * | 6/1996 | |
| JP | 11260748 A * | 9/1999 | |
| JP | 2000286207 A * | 10/2000 | |
| JP | 2001-226773 A | 8/2001 | |
| JP | 2001313269 A * | 11/2001 | |
| JP | 2003007692 A * | 1/2003 | |
| JP | 2003214957 A * | 7/2003 | |
| JP | 2004280013 A * | 10/2004 | |
| JP | 2005338265 A * | 12/2005 | |
| JP | 2006-112826 | 4/2006 | |
| JP | 2007040981 A * | 2/2007 | |
| JP | 2007-123843 A | 5/2007 | |
| JP | 2007-184564 A | 7/2007 | |
| JP | 2008-243937 * | 10/2008 | |
| JP | 2009094138 A * | 4/2009 | |

OTHER PUBLICATIONS

Definition of "window." www.thefreedictionary.com/window. Accessed. Mar. 18, 2014.*

* cited by examiner

PLASMA PROCESSING APPARATUS AND TEMPERATURE MEASURING METHOD AND APPARATUS USED THEREIN

CROSS-REFERENCE TO RELATED APPLICATIONS

This application claims the benefit of priority to Japanese Patent Application No. 2009-021205, filed on Feb. 2, 2009, and Japanese Patent Application No. 2009-074603, Mar. 25, 2009, entire contents of which are incorporated herein by reference.

FIELD OF THE INVENTION

The present invention relates to a plasma processing apparatus for processing a substrate, e.g., a semiconductor wafer, a substrate for a liquid display device, or the like, by using a plasma, and a temperature measuring method and apparatus used therein.

BACKGROUND OF THE INVENTION

In a plasma processing apparatus, it is very important to correctly measure temperature of a substrate to be processed, e.g., a semiconductor wafer or a substrate for a liquid display device, in order to accurately control shape and property of a film, a hole or the like formed thereon by various processes such as a film formation, etching and the like. Therefore, various methods such as a measurement method using a resistance thermometer, a fluorescent thermometer measuring a temperature of a backside of a substrate or the like, have been used to measure temperature thereof.

Recently, there has been proposed a temperature measurement technique using a low coherence interferometer capable of directly measuring temperature of a substrate, which has been difficult by using a conventional temperature measurement method. Further, there has been suggested a temperature measurement technology using such a low coherence interferometer, which can measure temperatures at plural measuring points at the same time (see, e.g., Japanese Patent Application Publication No. 2006-112826).

In the technology, a light beam from a light source is divided into a measurement beam for measuring a temperature and a reference beam by a first splitter and the measurement beam is further divided into n measurement beams by a second splitter. The n measurement beams are irradiated onto n measuring points and the reference beam is irradiated on a reference beam reflector. Then, an interference wave of reflected n measurement beams from the target and a reflected reference beam from the reference beam reflector is measured by a light receiving unit. With the technology, it is possible to measure temperatures at plural measuring points at one time with a simple configuration.

When a temperature of a substrate which is being processed by a plasma processing apparatus is measured by a temperature measuring apparatus by using the above low coherence interferometer, the substrate is mounted on a mounting table in a vacuum chamber under a vacuum atmosphere. Meanwhile, a collimator disposed at an outlet of an optical fiber for guiding a measurement beam is generally fixed to an outside of a base plate in a vacuum processing chamber. Herein, the outside of a base plate in the vacuum processing chamber normally set to be maintained at an atmospheric pressure, for convenience of maintainability such as an optical axis alignment or the like.

In the vacuum processing chamber, the mounting table for mounting thereon the substrate includes an electrostatic chuck for attracting and holding a substrate and an RF plate to which a high frequency power is applied, and the vacuum processing chamber is configured to be partitioned off into a space under the vacuum atmosphere and another space under the normal pressure atmosphere by them. Below the mounting table, in order to sufficiently insulate the RF plate and the base plate or install a driving unit of a pusher pin for loading and unloading a semiconductor wafer to and from the mounting table, there may have a space between the mounting table and the base plate.

In this configuration, the mounting table may be bent by the pressure difference between the vacuum and the atmospheric pressure, or may vibrate due to a flow of temperature-controlling cooling medium therein. Accordingly, the distance between the collimator and the substrate mounted on the mounting table can be changed, and an accurate temperature measurement cannot be achieved. Further, since there is the atmosphere in the space between the RF plate and the base plate, an optical path is affected by an air flow, thereby deteriorating measurement accuracy.

Moreover, the problems that the optical path is affected by the air flow and the measurement accuracy deteriorates are also seen when a temperature of a focus ring provided in the plasma processing apparatus is measured.

SUMMARY OF THE INVENTION

In view of the above, the present invention provides a plasma processing apparatus capable of measuring a temperature of a substrate or the like with high accuracy and performing plasma processing on the substrate with high accuracy and efficiency, a temperature measuring method and a temperature measuring apparatus used therein.

In accordance with a first aspect of the present invention, there is provided a plasma processing apparatus including: a vacuum chamber in which a substrate is accommodated and processed by a plasma; a mounting table provided in the vacuum chamber, for mounting thereon the substrate; a base plate provided below the mounting table while having a gap therebetween; and a temperature measuring unit including a light source, a splitter for dividing a light beam from the light source into a measurement beam and a reference beam, a reference beam reflector for reflecting the reference beam from the splitter, an optical path length altering unit for altering an optical path length of the reference beam reflected from the reference beam reflector, optical fibers for irradiating the measurement beam onto the substrate, collimators provided at an outlet of the optical fiber, and a light detecting unit for detecting an interference between the measurement beam reflected from the substrate and the reference beam reflected from the reference beam reflector.

Further, the plasma processing apparatus includes airtightly sealed temperature measuring windows provided in the mounting table, for optically communicating to transmit the measurement beam through a top surface and a bottom surface of the mounting table; and one or more connection members for connecting the mounting table and the base plate, which is provided in a space between the mounting table and the base plate. In the plasma processing apparatus, a space above the mounting table is set to be maintained under a vacuum atmosphere, and a space between the mounting table and the base plate is set to be maintained under a normal pressure atmosphere; and each collimator is fixed to the base plate at a position corresponding to each temperature measuring window, thereby measuring a temperature of the substrate via the temperature measuring windows by the temperature measuring unit.

In accordance with a second aspect of the present invention, there is provided a plasma processing apparatus including: a vacuum chamber in which a substrate is accommodated and processed by a plasma; a mounting table provided in the vacuum chamber, for mounting thereon the substrate; a base plate provided below the mounting table while having a gap therebetween; and a temperature measuring unit including a light source, a splitter for dividing a light beam from the light source into a measurement beam and a reference beam, a reference beam reflector for reflecting the reference beam from the splitter, an optical path length altering unit for altering an optical path length of the reference beam reflected from the reference beam reflector, optical fibers for irradiating the measurement beam onto the substrate, collimators provided at an outlet of the optical fiber, and a light detecting unit for detecting an interference between the measurement beam reflected from the substrate and the reference beam reflected from the reference beam reflector.

The plasma processing apparatus further includes airtightly sealed temperature measuring windows provided in the mounting table, for optically communicating to transmit the measurement beam through a top surface and a bottom surface of the mounting table. In the plasma processing apparatus, a space above the mounting table is set to be maintained under a vacuum atmosphere, and a space between the mounting table and the base plate is set to be maintained under a normal pressure atmosphere; and each collimator is fixed to the mounting table at a position corresponding to each temperature measuring window, thereby measuring a temperature of the substrate via the temperature measuring windows by the temperature measuring unit.

In accordance with a third aspect of the present invention, there is provided a plasma processing apparatus including: a vacuum chamber where a substrate is accommodated and processed by a plasma; a focus ring installed in the vacuum chamber; and a window portion provided on a wall of the vacuum chamber, for transmitting a light beam from and to the vacuum chamber therethrough.

The plasma processing apparatus further includes a temperature measuring unit including a light source, a splitter for dividing a light beam from the light source into a measurement beam and a reference beam, a reference beam reflector for reflecting the reference beam from the splitter, an optical path length altering unit for altering an optical path length of the reference beam reflected from the reference beam reflector, optical fibers for irradiating the measurement beam onto the focus ring, collimators provided at outlets of the optical fibers, and a light detecting unit for detecting an interference between the measurement beam reflected from the focus ring and the reference beam reflected from the reference beam reflector.

In the plasma processing apparatus, the collimators are disposed outside the window portion, a temperature of the focus ring is measured by irradiating the measurement beam emitted through the collimator onto the focus ring via the window portion along an optical path altered by an optical path altering unit provided on the focus ring, returning the measurement beam reflected from the focus ring along the optical path altered by the optical path altering unit to the window portion and then to the collimator.

In accordance with a fourth aspect of the present invention, there is provided a temperature measuring method of measuring temperature of a focus ring in a plasma processing apparatus including a vacuum chamber where a substrate is accommodated and processed by a plasma; and the focus ring installed in the vacuum chamber, the temperature measuring method including forming, on a wall of the vacuum chamber, a window portion which transmits a light beam from and to the vacuum chamber; and providing, outside the window portion, a collimator of a temperature measuring unit.

The temperature measuring unit includes a light source, a splitter for dividing a light beam from the light source into a measurement beam and a reference beam, a reference beam reflector for reflecting the reference beam from the splitter, an optical path length altering unit for altering an optical path length of the reference beam reflected from the reference beam reflector, an optical fiber for irradiating the reference beam onto the focus ring, a collimator provided at an outlet of the optical fiber, and a light detecting unit for detecting an interference between the measurement beam reflected from the focus ring and the reference beam reflected from the reference beam reflector.

Further, the temperature measuring method includes measuring a temperature of the focus ring by irradiating the measurement beam emitted through the collimator onto the focus ring via the window portion along an optical path altered by an optical path altering unit provided on the focus ring and returning the measurement beam reflected from the focus ring to the window portion and then to the collimator along the optical path altered by the optical path altering unit.

In accordance with a fifth aspect of the present invention, there is provided a temperature measuring apparatus for measuring a temperature of a focus ring installed in a vacuum chamber, the temperature measuring apparatus including a temperature measuring unit including a light source, a splitter for dividing a light beam from the light source into a measurement beam and a reference beam, a reference beam reflector for reflecting the reference beam from the splitter, an optical path length altering unit for altering an optical path length of the reference beam reflected from the reference beam reflector, an optical fiber for irradiating the reference beam to the focus ring, a collimator provided at an outlet of the optical fiber, and a light detecting unit for detecting an interference between the measurement beam reflected from the focus ring and the reference beam reflected from the reference beam reflector.

Further, the temperature measuring apparatus includes an optical path altering unit for altering an optical path of the measurement beam so as to irradiate onto the focus ring the measurement beam emitted through the collimator provided outside the window portion formed on a wall of the vacuum chamber and transmitted through the window portion, and return the measurement beam reflected from the focus ring via the window portion to the collimator.

With the present invention, the temperature of the substrate or the like can be controlled more accurately and, thus, the plasma processing can be efficiently performed with high accuracy.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
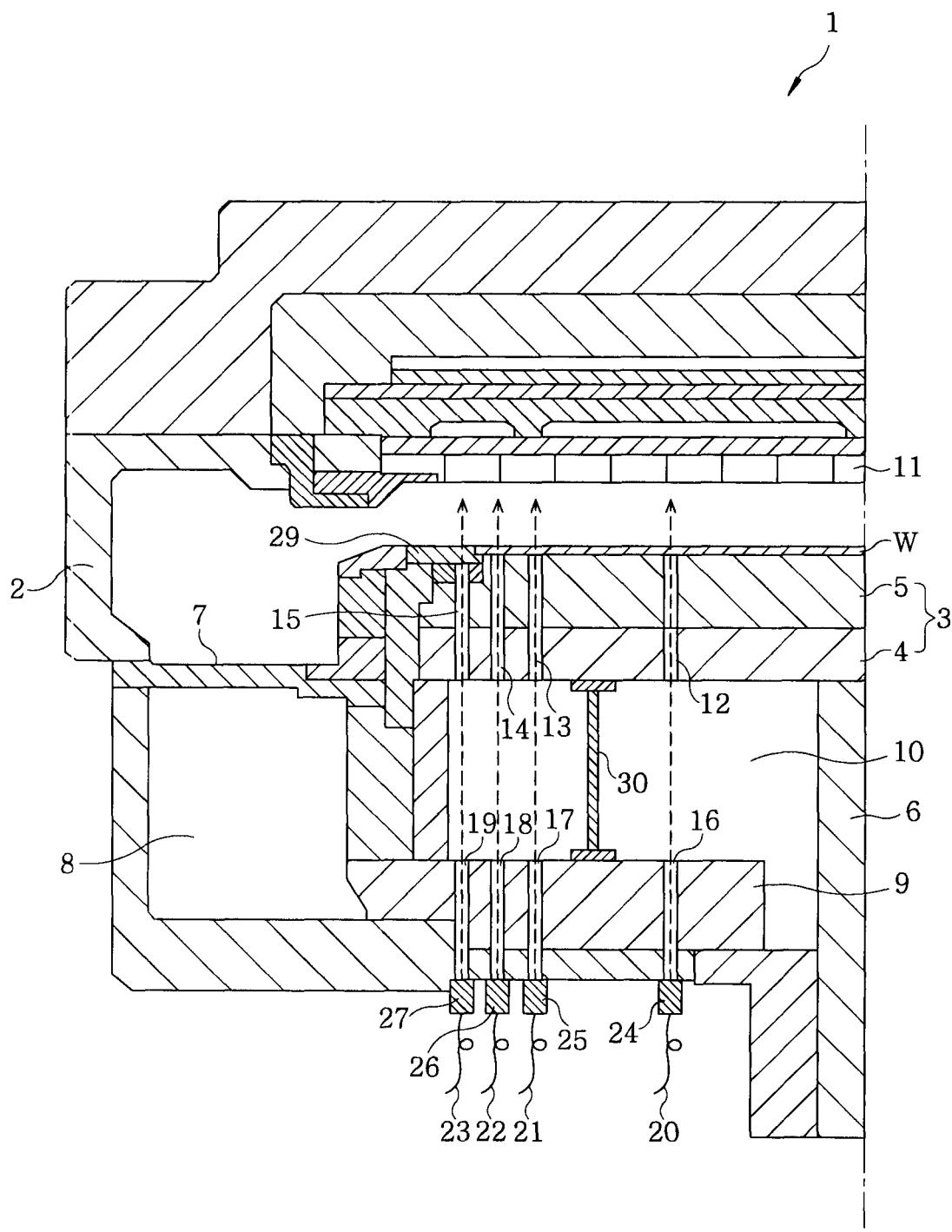
FIG. 1 is a cross sectional view showing a schematic configuration of principal parts of a plasma processing apparatus in accordance with an embodiment of the present invention.

The embodiments of the present invention will be described with reference to the accompanying drawings which form a part hereof. Further, like reference numerals will be given to like parts having substantially the same functions throughout the specification and the drawings, and redundant description thereof will be omitted.

FIG. 1 is a cross sectional view showing a schematic configuration of principal parts of a plasma processing apparatus 1 in accordance with an embodiment of the present invention. As illustrated in FIG. 1, the plasma processing apparatus 1 includes a vacuum chamber 2 where a semiconductor wafer W as a substrate is accommodated and processed by using a plasma.

A mounting table 3 for mounting thereon the semiconductor wafer W is provided in the vacuum chamber 2. The mounting table 3 is made of an electrical conductive material, and includes an RF plate 4 to which a high frequency power is applied; and an electrostatic chuck 5 provided on the RF plate 4 to attract and hold the semiconductor wafer W. A central portion of the RF plate 4 is connected to a power feed bar 6 electrically connected to a high frequency power supply (not shown).

An annular baffle plate 7 is provided to surround the mounting table 3 and an annular gas exhaust space 8 for uniformly exhausting gas from the periphery of the mounting table 3 is formed below the baffle plate 7. Moreover, a base plate 9 is provided on a bottom portion of the vacuum chamber 2 and a space gap 10 is formed between the RF plate 4 and the base plate 9.

The space gap 10 is sufficiently big enough to insulate the RF plate 4 and the base plate 9 from each other. Installed in the space gap 10 is a driving unit (not shown) of a pusher pin which receives the semiconductor wafer W from a transfer arm to load it on the mounting table 3 and unload the semiconductor wafer W from the mounting table 3 to transfer it to the transfer arm. Further, the space gap 10 is set to be under the atmospheric environment, not under the vacuum.

A facing electrode 11 is disposed above the mounting table 3 to face the mounting table 3 while having a gap therebetween. The facing electrode 11 includes a so-called shower head such that a predetermined processing gas can be supplied to the semiconductor wafer W mounted on the mounting table 3 in a shower form. The facing electrode 11 may be grounded or a high frequency power may be applied thereto. In addition, a focus ring 29 is installed around the semiconductor wafer W on the mounting table 3. The focus ring 29 improves in-plane uniformity of the plasma processing of the semiconductor wafer W.

In the vacuum chamber 2, a space above the mounting table 3 is set to be in the vacuum environment, whereas the space gap 10 below the mounting table 3 is set to be under the atmosphere environment. Therefore, the mounting table 3 is included as a part of a partition separating the vacuum and the atmosphere. Further, a plurality of temperature measuring windows, e.g., four in the example shown in FIGS. 1, 12 to 15 are formed at the mounting table 3. The temperature measuring windows 12 to 15 have airtightly sealed structures and the space above the mounting table 3 and the space gap 10 can optically communicate so that the measurement beams can penetrate the top surface and the bottom surface of the mounting table 3.

In this embodiment, among the temperature measuring windows 12 to 15, the temperature measuring window 15 positioned at an outermost portion of the mounting table 3 is used to measure a temperature of the focus ring 29. Each of the other temperature measuring windows 12 to 14 is used to measure a temperature of the semiconductor wafer W.

Figure 2:
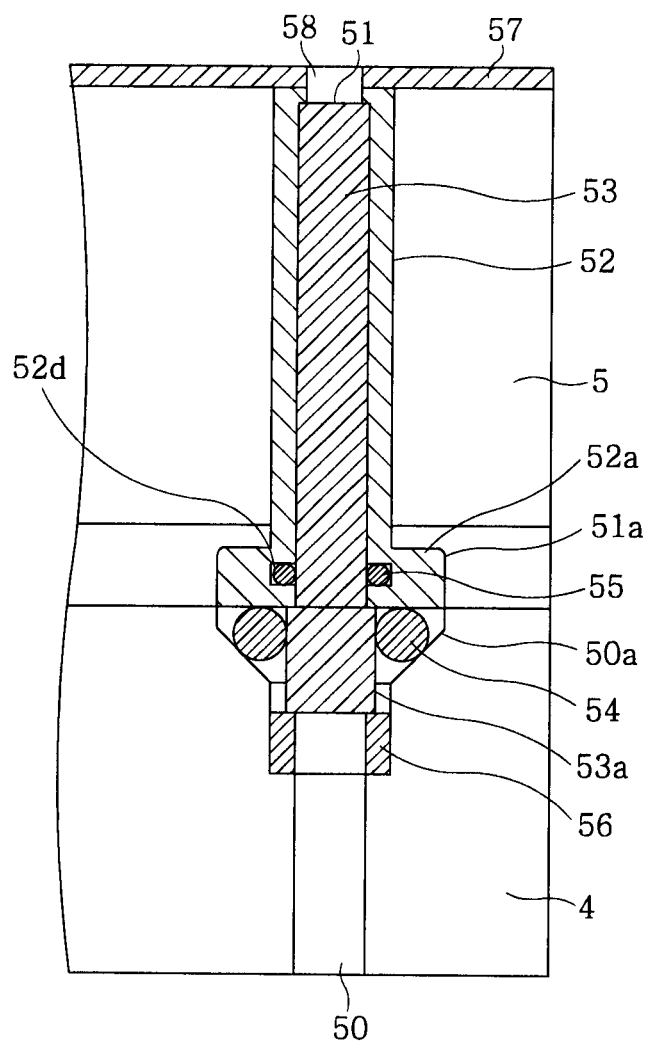
FIG. 2 depicts an enlarged view of the configuration of the principal parts of the plasma processing apparatus shown in FIG. 1.

FIG. 2 is an enlarged view showing configurations of the temperature measuring windows 12 to 15. As shown in FIG. 2, the mounting table 3 is provided with a through hole 50 penetrating through the RF plate 4 and a through hole 51 penetrating through the electrostatic chuck 5. The through hole 51 of the electrostatic chuck 5 has a large diameter portion 51a having a diameter larger than its inner diameter at a lower end thereof. Formed at an upper end of the through hole 50 of the RF plate 4 is an inclined surface 50a gradually widening its opening upwardly.

Fixed inside the through hole 51 of the electrostatic chuck 5 is an approximately cylindrical sleeve 52, which has a flange 52a enlarged outward at a lower end thereof and a recess 52d formed along an inner periphery of the flange 52a. The sleeve 52 is made of ceramic, resin, alumite or the like. Inserted into the sleeve 52 and the through hole 50 penetrating through the RF plate 4 is an approximately columnar window member 53 made of a material, e.g., quartz, sapphire or the like, which transmits the temperature measuring beam (infrared ray). The window member 53 has a large diameter portion 53a at a lower end thereof, i.e., the through hole 50, and is correctly positioned by making a contact between an outer periphery of a top surface of the large diameter portion 53a and an inner periphery of a bottom surface of the sleeve 52.

A vacuum sealing O-ring 54 is provided at the large diameter portion 53a of the window member 53. The vacuum sealing O-ring 54 is pressed by the large diameter portion 53a, the bottom surface of the sleeve 52, and the inclined surface 50a of the RF plate 4, thereby maintaining the airtightness. Moreover, an O-ring 55 for preventing slipping-off of the window member 53 is disposed in the recess 52d of the sleeve 52. In the through hole 50, a cylindrical buffering material 56 is provided to make a contact with an outer periphery of a bottom surface of the large diameter portion 53a of the window member 53.

In addition, a protective film 57 made of a ceramic plate, a polyimide film, a flame sprayed film, alumite, sapphire or the like is formed on the top surface of the electrostatic chuck 5. Furthermore, openings 58 having a diameter ranging from, e.g., about 1 mm to 3 mm, are formed on the portions of the protective film 57 where the temperature measuring windows 12 to 15 are disposed.

As seen from FIG. 1, through holes 16 to 19 are formed in the base plate 9 to correspond to the temperature measuring windows 12 to 15 and collimators 24 to 27 are fixed to these through holes, which are provided at outlets of optical fibers 20 to 23 for guiding the measuring beams from the temperature measurement unit. Further, a connection member 30 for connecting the base plate 9 and the mounting table 3 (the RF plate 4) is disposed in the space gap 10 between the base plate 9 and the mounting table 3 (the RF plate 4). Although a single connection member 30 is illustrated in FIG. 1, a plurality of (e.g., four or more) connection members 30 are arranged along the circumferential direction. These connection members 30 serve to suppress deformation or vibration of the mounting table 3.

Figure 3:
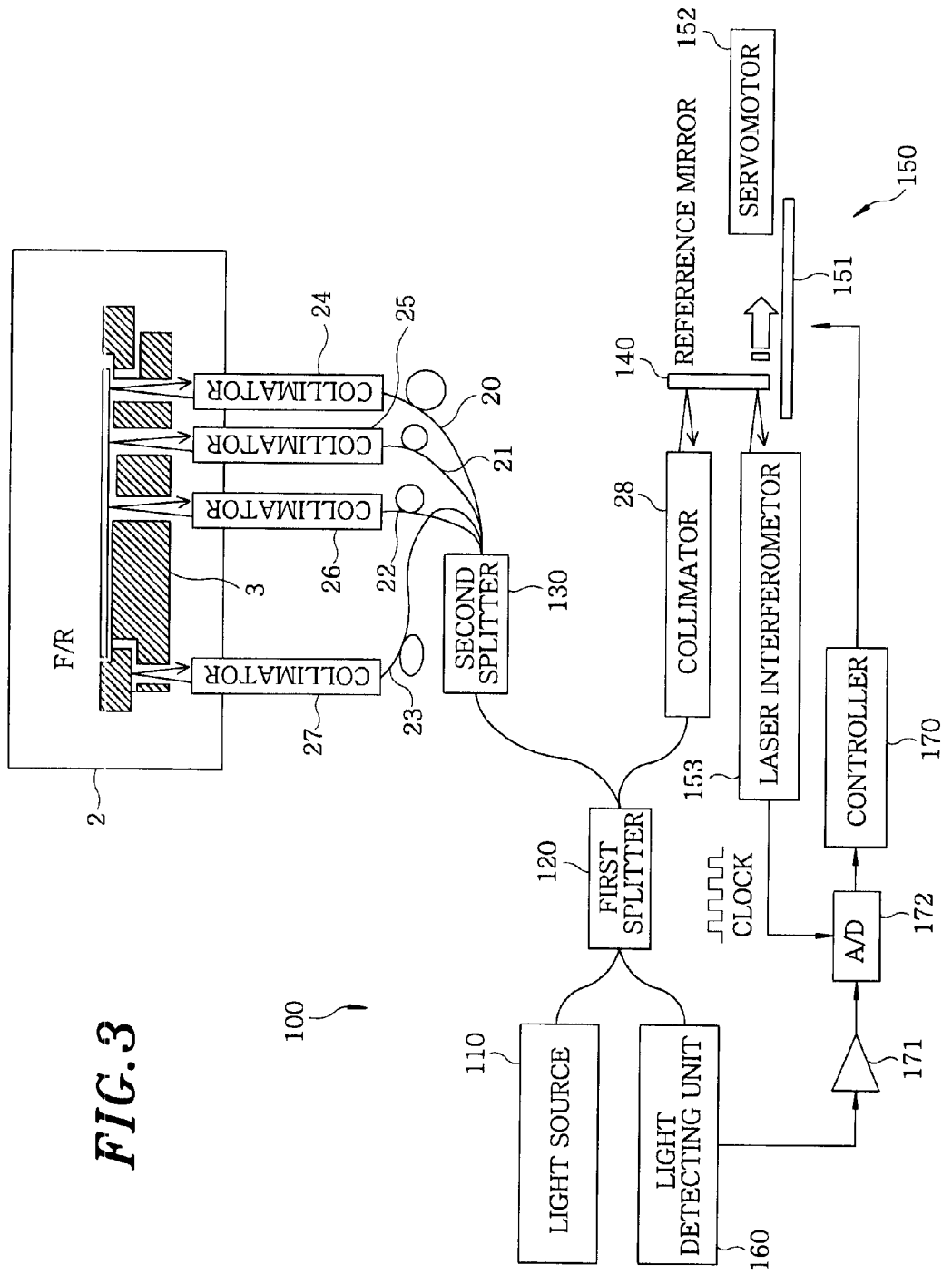
FIG. 3 provides a block diagram showing a schematic configuration of a temperature measuring unit of the plasma processing apparatus shown in FIG. 1.

The optical fibers 20 to 23 are connected to the temperature measuring unit 100 configured as shown in FIG. 3. As depicted in FIG. 3, the temperature measuring unit 100 includes a light source 110; a first splitter 120 for dividing a light beam from the light source 110 into a measurement beam for temperature measurement and a reference beam; and a second splitter 130 for dividing the measurement beam from the first splitter 120 into a first to an nth measurement beams (n being four in this embodiment). The temperature measuring unit 100 further includes a reference bean reflector 140 for reflecting the reference beam from the first splitter 120 and an optical path length altering unit 150 for altering an optical path length of the reference beam reflected from the reference beam reflector 140.

The optical path length altering unit 150 includes a linear stage 151 for moving the reference beam reflector 140, in a single direction parallel to a direction in which the reference beam enters; a servo motor 152; a laser interferometer 153 and the like. The reference beam reflector 140 may include, e.g., a reference mirror or the like. As described above, the optical path length of the reference beam reflected from the reference beam reflector 140 can be altered by driving the reference beam reflector 140 in a single direction. The servo motor 152 is controlled by a controller 170. Further, a signal from the laser interferometer 153 is converted into a digital signal by an A/D converter 172, and then is inputted to the controller 170.

Further, the temperature measuring unit 100 includes a light detecting unit 160 for measuring an interference of the first to the fourth measurement beams reflected from a temperature measurement target such as the semiconductor wafer W, the focus ring 29 or the like, when the first to the fourth measurement beams are irradiated onto first to nth measuring points at the temperature measurement target, with the reference beam reflected from the reference beam reflector 140 as the reference beam is irradiated onto the reference beam reflector 140.

No particular restrictions are imposed on the type of light emitted from the light source 110 as long as it can be used to measure the interference between the measurement beams and the reference beam. If the temperature measurement target is a semiconductor wafer W, for instance, the light from the light source 110 has to be such that no interference is induced at least with reflected light beams from points set apart by the distance between the top surface and the bottom surface of the semiconductor wafer W (typically, about 800 μm to 1500 μm).

To be specific, it is preferable to use, e.g., a low coherence light. The term 'low coherence light' refers to light with a short coherence length. A central wavelength of the low coherence light preferably ranges from, e.g., about 0.3 μm to 20 μm, and more preferably from about 0.5 μm to 5 μm. Further, the coherence length ranges preferably from, e.g., about 0.1 μm to 100 μm, and more preferably about 3 μm or less. By using the light source 110 that emits such low coherence light, any problems attributable to unnecessary interference can be avoided and the interference of the reflected measurement beam from the surface or an inner layer at the semiconductor wafer with the reference beam can be measured with ease.

Light sources that generate the type of low coherence light described above include, e.g., an SLD (super luminescent diode), an LED, a high brightness lamp (a tungsten lamp, a xenon lamp and the like), a super wideband wavelength light source. Among these low coherence light sources, an SLD with its high brightness performance (whose wavelength is, e.g., about 1300 nm) is preferably used as the light source 110.

An optical fiber coupler, for example, is used as the first splitter 120. However, the present invention does not limit the first splitter 120 to an optical fiber coupler, and any type of splitter may be used as long as it is capable of splitting light into a reference beam and a measurement beam. As the second splitter 130, e.g., an optical fiber coupler may be used. However, the present invention does not limit the second splitter 130 to an optical fiber coupler, and any type of splitter may be used as long as it is capable of splitting the measurement beam into the first through the nth measurement beam. Alternatively, each of the first splitter 120 and the second splitter 130 may include, e.g., a light waveguide channel-type wave splitter, a semi-transparent mirror or the like.

The reference beam reflector 140 may include, e.g., a reference mirror. The reference mirror may be, e.g., a corner cube prism, a plane mirror or the like. It is particularly desirable to use a corner cube prism, which assures a desired parallelism between the reflected beam and the incident beam. However, the reference beam reflector 140 is not limited thereto and may include, e.g., a delay line or the like instead of a corner cube prism, as long as it is capable of reflecting the reference beam.

The light detecting unit 160 preferably includes, e.g., an inexpensive and compact photodiode. More specifically, the light detecting unit 160 may include a PD (photodetector) achieved by using, e.g., a Si photodiode, an InGaAs photodiode, a Ge photodiode or the like. However, the light detecting unit 160 is not limited to the examples listed above, and may instead include an avalanche photodiode, a photomultiplier tube or the like, as long as it can measure the interference between the measurement beams from the temperature measurement target and the reference beam reflected from the reference beam reflector 140.

The detection signal from the light detecting unit 160 is inputted to the A/D converter 172 via an amplifier 171, converted into a digital signal, and then processed by the controller 170.

The reference beam from the first splitter 120 is transmitted via an optical fiber and the collimator 28 to a reference beam irradiating position and then irradiated onto the reference beam reflector 140. Meanwhile, the first to the fourth measurement beams from the second splitter 130 are transmitted via the optical fibers 20 to 23 and the collimators 24 to 27 to measurement beam irradiating positions, respectively, and then irradiated onto the respective measuring points of the semiconductor wafer W and the focus ring 29.

In the temperature measuring unit 100, the optical path lengths of the first to the fourth measurement beams extending from the second splitter 130 to the temperature measurement target differ from one another. More specifically, if the lengths of the optical fibers 20 to 23 are equal, the front end surfaces of the collimators 24 to 27, i.e., the measurement beam irradiating positions, are offset relative to the temperature measurement target by varying extents along the direction substantially parallel to the irradiating direction. Further, the optical path lengths of the first to the fourth measurement beams extending from the second splitter 130 to the temperature measurement target may be varied without offsetting the front end surfaces of the collimators 24 to 27 by varying the lengths of the optical fibers 20 to 23.

Further, when the optical path lengths of the first to the fourth measurement beams are offset by varying the extents thereof relative to the temperature measurement target, it is necessary to ensure that the interference waves induced by the first to the fourth measurement beams and the reference beam, which are measured at the individual measuring points, at least, are not superimposed upon one another. For instance, if the light source 110 is a low coherence light source, the overlapping of the interference waves can be prevented by setting each of the optical path lengths to be offset by an extent greater than or equal to at least the coherence length of the interference waves.

In addition, it is desirable to determine the offset of the optical path lengths by taking into consideration of the thickness of the temperature measurement target, the rate at which the thickness changes, the temperature measurement range, the distance by which the reference mirror is moved and the like. More specifically, in the case of a silicon wafer having a thickness of, e.g., about 0.7 mm, the reference mirror is moved by a distance of approximately 0.04 mm in the temperature range from room temperature to 200° C. Hence, by setting to be offset by about 0.1 mm in the optical path lengths of the first to the fourth measurement beams, the interference waves can be prevented from being overlapped at the measuring points.

Namely, by scanning the reference beam reflector 140 only once, the interference waves can be simultaneously detected at the measuring points onto which the first to the fourth measurement beams are irradiated. This can extremely shorten the time required for the temperature measurement.

Figure 4:
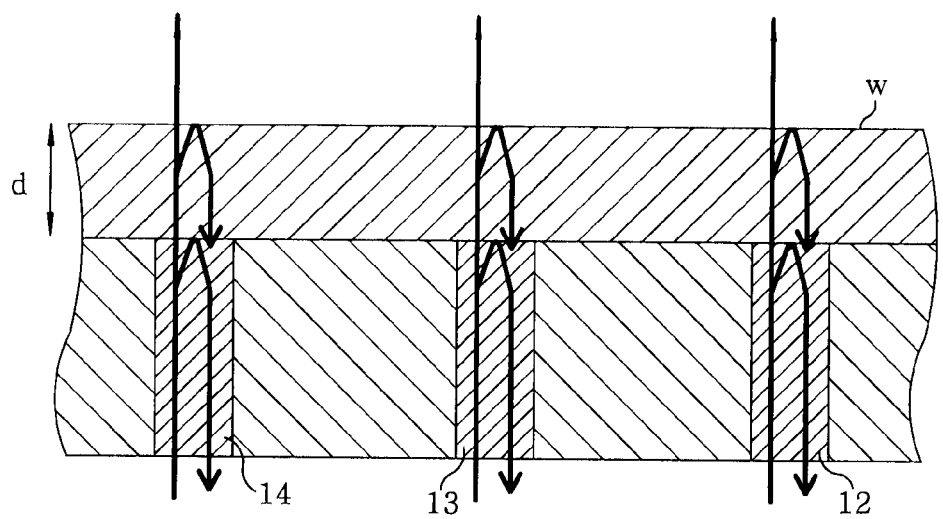
FIG. 4 is a view for explaining a state of reflection of measurement beams.

In the above-configured plasma processing apparatus 1, the temperature measurement beams irradiated through the temperature measuring windows 12 to 15 onto the semiconductor wafer W are reflected by both the top surface and the bottom surface thereof, as shown in FIG. 4, and the interference waves of the reflected beams therefrom and the reference beam are detected.

Figure 5A:
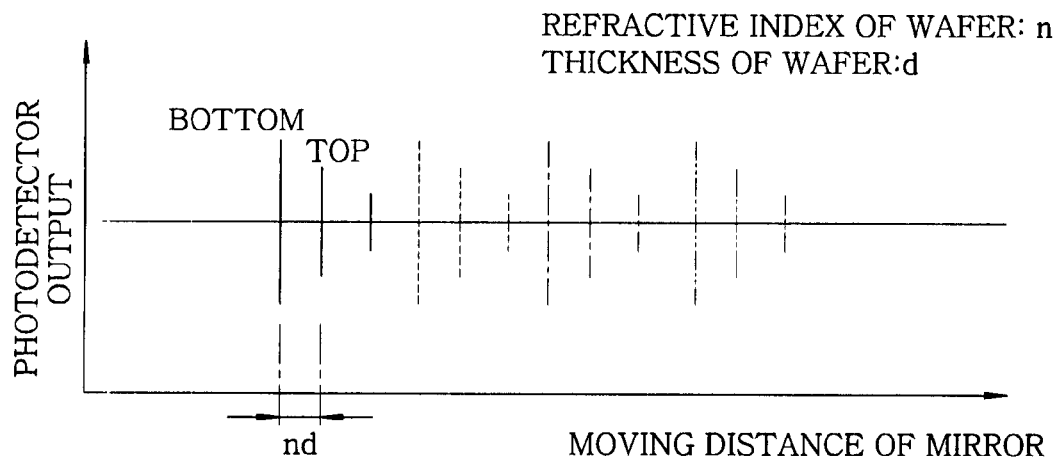
FIGS. 5A and 5B show examples of interference waves of measurement beams irradiated onto plural measuring points.

To be specific, if the refractive index and the width of the semiconductor wafer W are n and d, respectively, the interference wave of the measurement beams reflected from the bottom surface of the semiconductor wafer W (indicated as "bottom" in the drawing) and that of the measurement beam reflected from the top surface of the semiconductor wafer W (indicated as "top" in the drawing) are detected at positions spaced apart from each other by a distance of nd, as shown in FIG. 5A. Further, because optical path lengths to each of the measuring points are different, the peaks of the interference waves at each measuring point are detected at positions spaced apart from each other by a distance corresponding to the offset in the optical path lengths, as illustrated in FIG. 5A.

In FIG. 5A, the Y-axis indicates an output of the light detecting unit and the X-axis represents a moving distance of the mirror serving as a reference beam reflector. In FIG. 5A, the interference waves at each of the measuring points are depicted by a solid line, a dotted line, a dashed dotted line, and a dashed double-dotted line, respectively.

When the temperature of the semiconductor wafer W or the like as a temperature measurement target is measured by the temperature measuring unit 100, firstly, an initial thickness of the temperature measurement target is measured. More specifically, the waves as shown in FIG. 5A are detected. Then, the initial thickness of the temperature measurement target can be calculated based on a distance between, e.g., the 'top' interference wave and the 'bottom' interference wave among the interference waves shown in FIG. 5A. Furthermore, the temperature of the temperature measurement target is detected based on a change from the initial thickness, i.e., the change in the distance between, e.g., the 'top' interference wave and the 'bottom' interference wave in FIG. 5A.

In the temperature measuring unit 100, a light beam from the light source 110 enters the first splitter 120 which divides it into a measurement beam and a reference beam. The measurement beam is further divided into a first to an nth measurement beams by the second splitter 130. The first to the nth measurement beams are irradiated onto the temperature measurement target such as a semiconductor wafer or the like at the respective measuring points and then are reflected by a top surface, an interface or a bottom surface of each layer.

Meanwhile, the reference beam is reflected by the reference beam reflector 140. Moreover, the reflected beams of the first to the nth measurement beams are inputted to the first splitter 120 via the second splitter 130 and then are detected by the light detecting unit 160 together with the reflected reference beam.

Further, by scanning the reference beam reflector 140, it is possible to obtain the interference waves shown in FIG. 5A, in which the Y-axis represents an output of the light detecting unit 160 and the X-axis represents a moving distance of the reference beam reflector 140. Herein, the light source 110 is a low coherence light source. When a low coherence light source 110 which emits light with a small coherence length is used, intense interference occurs at a position where the optical path length of a measurement beam and the optical path length of a reference beam match while the extent of interference is substantially lowered elsewhere under normal circumstances.

Therefore, by moving the reference beam reflector 140 along, e.g., the direction in which the reference beam is radiated so as to alter the optical path length of the reference beam, the interference of the reflected reference beam with the reflected measurement beams can be induced at any layer within the temperature measurement target as well as at the bottom surface and the top surface thereof due to the difference between their refractive indices.

Hereinafter, a method for measuring a temperature based on the interference wave of the measurement beam and the reference beam will be described in detail. The method for measuring the temperature based on the interference wave may be, e.g., a temperature conversion method that is achieved by detecting a change in the optical path length resulting from a temperature change. Herein, the temperature conversion method achieved by detecting positional shifts of the interference waveforms will be explained.

When the temperature measurement target such as the semiconductor wafer W or the like is heated by a plasma or the like, the temperature measurement target expands, thereby inducing a change in its refractive index. As a result, positions of the interference waveforms are shifted and the intervals between the interface waveform peaks change relative to those before the temperature change. If the temperature changes at each measuring point, the position of the interference waveform at each measuring point is shifted, thereby leading to a change in the interval between the interference waveform peaks.

Therefore, by measuring the interval between the interference waveform peaks at the measuring point, the change in the temperature having occurred at the measuring point can be detected. For example, in the temperature measuring unit 100 shown in FIG. 3, the intervals between the interference waveform peaks change in correspondence to the distance over which the reference beam reflector 140 moves. Hence, by measuring the distance over which the reference beam reflector 140 is moved, indicating the interval between the interference waveform peaks, the change in temperature can be detected.

If the thickness and the refractive index of the semiconductor wafer W serving as the temperature measurement target is d and n, respectively, the extent to which the peak position of the interference waveform is shifted is dependent upon the coefficient of linear expansion a inherent to each layer along the thickness d and the extent of change in the refractive index n is primarily dependent upon the temperature coefficient β of refractive index change inherent to each layer. It is to be noted that the temperature coefficient β of refractive index change is known to be also dependent upon the wavelength.

Therefore, a thickness d' of the semiconductor wafer W which is measured at a certain measuring point P after the temperature change is expressed as in Eq. (1) below. Herein, $\Delta T$ represents a temperature change at the certain measuring point; α indicates a linear expansion coefficient; and β represents a temperature coefficient of the refractive index change. Further, d and n indicate a thickness and a refractive index at the measuring point P before the temperature change, respectively.

$$d' = d \cdot (1 + \alpha \Delta T), n' = n \cdot (1 + \beta \Delta T) \quad \text{Eq. (1)}$$

As can be seen from Eq. (1), the optical path length of the measurement beam transmitted through the measuring point P changes as the temperature changes. The optical path length is normally indicated as product of the thickness d by the refractive index n. Accordingly, if the optical path length of the measurement beam transmitted through the measuring point P before the temperature change is L; and the optical path length measured at the measuring point is L' after the temperature is changed by $\Delta T$, L and L' can be expressed as in Eq. (2) below.

$$L = d \cdot n, \quad L' = d' \cdot n' \quad \text{Eq. (2)}$$

Accordingly, a difference L−L' between the optical path lengths of the measurement beam at the measuring point before and after the temperature change can be calculated by Eqs. (1) and (2). The calculated result is expressed as in Eq. (3) below, and it is also to be noted that the Eq. (3) does not include any infinitesimal terms in consideration of $\alpha\beta \ll \alpha$ and $\alpha\beta \ll \beta$.

$$L' - L = d' \cdot n' - d \cdot n \approx d \cdot n \cdot (\alpha + \beta) \cdot \Delta T = L \cdot (\alpha + \beta) \cdot \Delta T \quad \text{Eq. (3)}$$

Herein, the optical path length of the measurement beam at each measuring point is equivalent to the interval between the peaks in the waveforms of the interference of the measurement beam and the reference beam at the measuring point. Therefore, if a linear expansion rate α and a temperature coefficient β of refractive index change are known in advance, the temperature at the measuring point P can be calculated through conversion by using Eq. (3) by measuring the interval between the peaks in the interference waveforms at each measuring point.

When converting an interference waveform peak interval to a temperature as described above, it is necessary to ascertain in advance the coefficient of linear expansion α and the temperature coefficient β of refractive index change since the coefficient of linear expansion α and the temperature coefficient β of refractive index change affect the optical path length indicated by the interval between the interference waveform peaks. Generally speaking, the coefficient of linear expansion α and the temperature coefficient β of refractive index change of an object such as a semiconductor wafer W may be dependent upon the temperature in certain temperature ranges.

For example, since the coefficient of linear expansion α does not normally change significantly as long as the temperature of the substance is in a range from about 0° C. to 100° C., the coefficient of linear expansion may be regarded to be constant in this range. However, once the temperature exceeds about 100° C., the coefficients of linear expansion of some materials start to change by greater extents as the temperature becomes higher and, in such a case, the temperature dependency cannot be disregarded. Likewise, the temperature dependency of the temperature coefficient β of refractive index change cannot be disregarded in a certain temperature range, either.

For instance, it is known that the coefficient of linear expansion α and the temperature coefficient β of refractive index change of silicon (Si) of a wafer can be approximated with quadratic curves in the temperature range from about 0°

C. to 500° C. As described above, the coefficient of linear expansion α and the temperature coefficient β of refractive index change are dependent on the temperature and accordingly, by ascertaining the values of the coefficient of linear expansion α and the temperature coefficient β of refractive index change corresponding to a specific temperature in advance and by using these values in the temperature conversion, the temperature can be calculated with an even higher level of accuracy.

The temperature measurement method using the interference wave induced by the measurement beam and the reference beam is not limited to the above-described method, and may also be, e.g., a method using a change in absorption intensity based on a temperature change. Further, it is also possible to combine the method using a change in the optical path length due to a temperature change and the method using a change in absorption intensity due to a temperature change.

As described above, the temperature measuring unit 100 measures a temperature in principle based on the optical path length of the measurement beam. If the optical path length is changed due to factors other than the change in temperature of the temperature measurement target, it is considered as a noise and makes it difficult to measure a temperature of the temperature measurement target with high accuracy.

Meanwhile, in the plasma processing apparatus 1 of FIG. 1, the temperature measuring windows 12 to 15 are provided at the mounting table 3. Further, a space above the mounting table 3 is set to be under a high vacuum atmosphere, whereas a space below the mounting table 3 is set to be under a normal pressure atmosphere. Accordingly, the mounting table 3 tends to be bent due to the pressure difference or vibrate due to a flow of a temperature controlling medium in the electrostatic chuck 5.

If the mounting table 3 is bent or vibrates, the distance between the mounting table 3 and the base plate 9 is changed. This leads to a change in the distance between the collimators 24 to 27 and the temperature such as the semiconductor wafer W or the like and, further, the change in the optical path length, in the temperature measuring unit 100.

For that reason, in this embodiment, a connection member 30 for connecting the base plate 9 and the mounting table 3 (the RF plate 4) is provided to suppress the deformation or the vibration of the mounting table 3. With such configuration, the change in the optical path length in the temperature measuring unit 100 can be prevented. The generation of noise can be suppressed, so that the temperature of the semiconductor wafer W or the like can be detected with high accuracy. Since the temperature of the semiconductor wafer W or the like can be measured with high accuracy during the plasma processing, the plasma processing can be performed with high accuracy by controlling the state of the plasma processing based on the temperature measurement result.

Figure 6A:
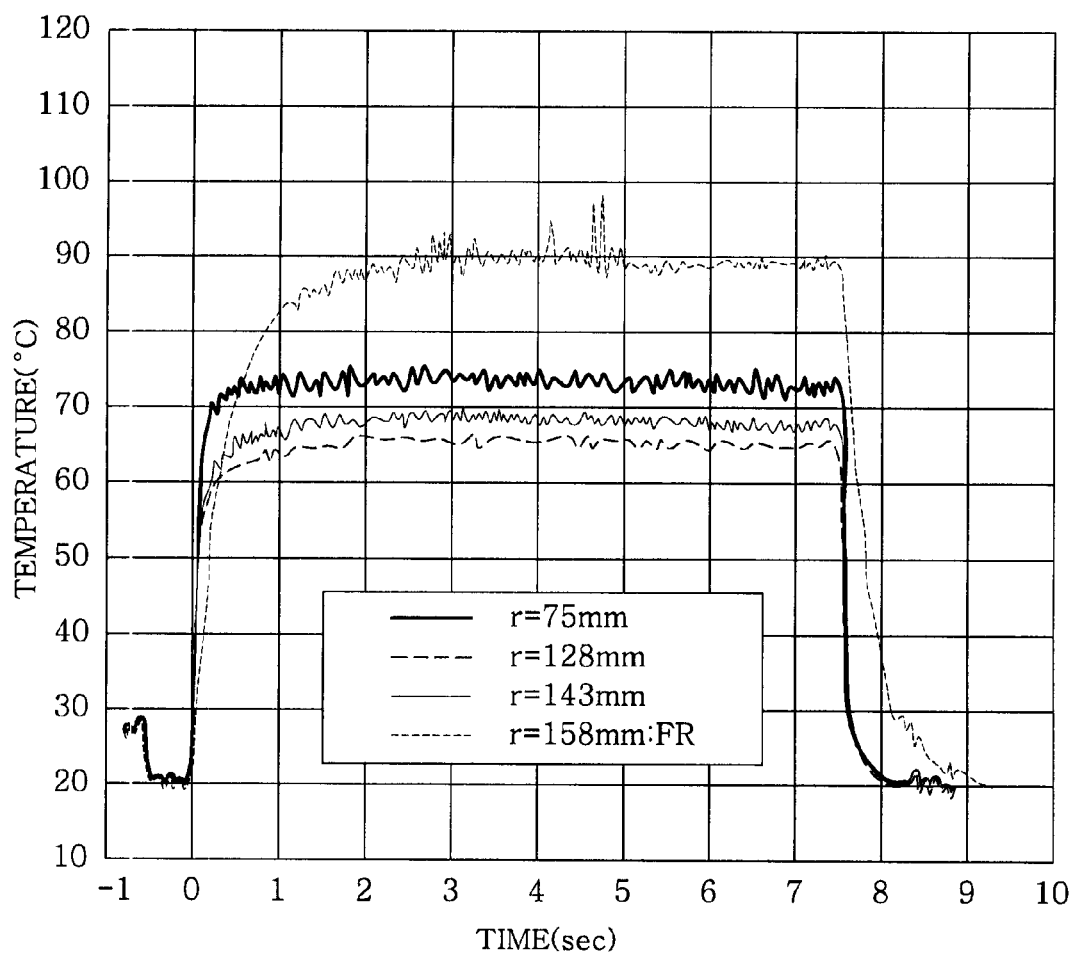
FIGS. 6A and 6B illustrate exemplary temperature measurement results in the plasma processing apparatus of FIG. 1.
Figure 6B:
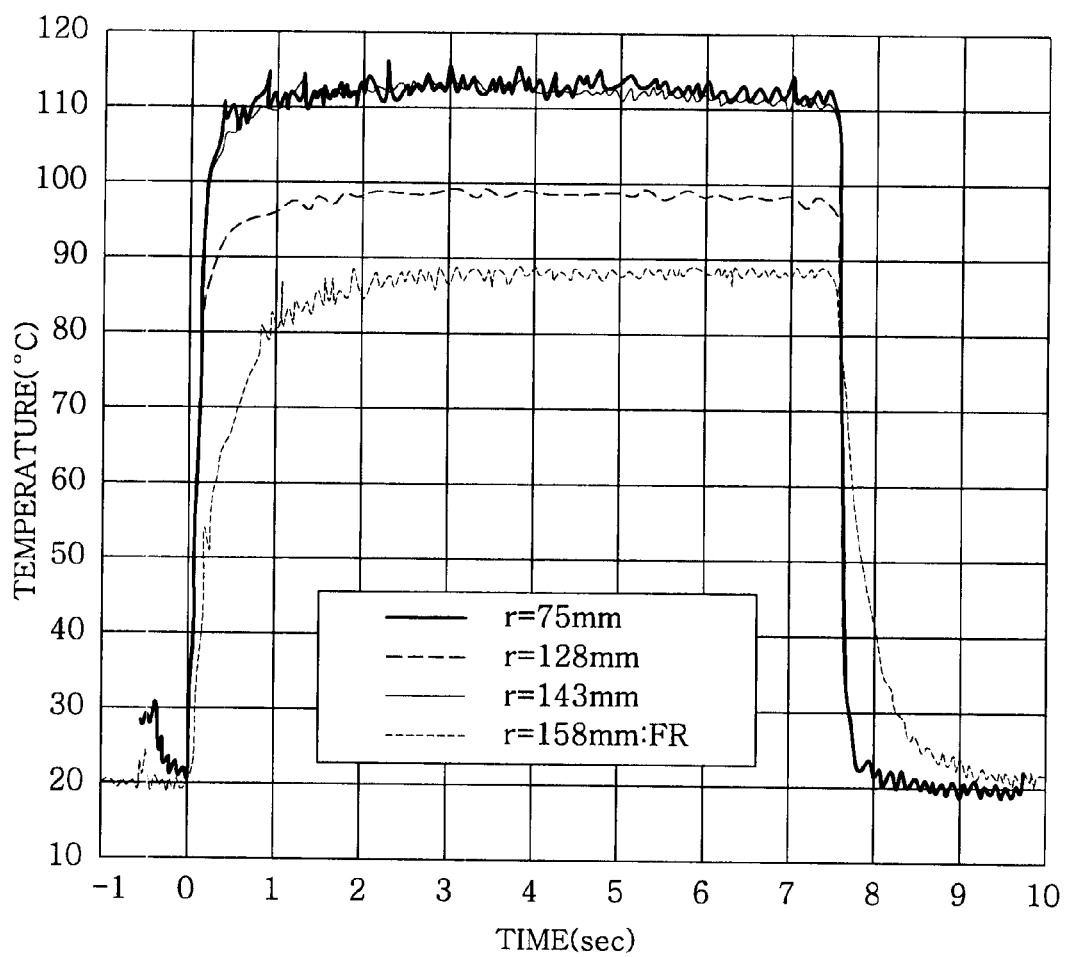

FIGS. 6A and 6B present results of measuring temperatures at positions spaced apart from the center of the semiconductor wafer W by about 75 mm, 128 mm, 143 mm and 158 mm (focus ring), respectively, while generating a plasma in the plasma processing apparatus 1 configured as described above. FIG. 6A shows the case where a pressure of cooling helium gas supplied between the mounting table 3 and the bottom surface of the semiconductor wafer W is set to be maintained at about 2000 Pa (15 Torr)/5320 Pa (40 Torr) (the former being the pressure at the central portion of the wafer W, the latter being the pressure at the peripheral portion of the wafer W). In this case, the temperature of the semiconductor wafer W increases from about 20° C. to 65° C.~75° C. due to the excitation of the plasma.

On the other hand, FIG. 6B describes the case where the helium gas is not substantially supplied by setting its pressure to 0 Pa. In that case, the temperature of the semiconductor wafer W is higher than about 110° C. at the positions spaced apart from the center of the wafer W by about 75 mm and about 143 mm. The temperature of the focus ring is not changed regardless of the presence of the helium gas.

Figure 7:
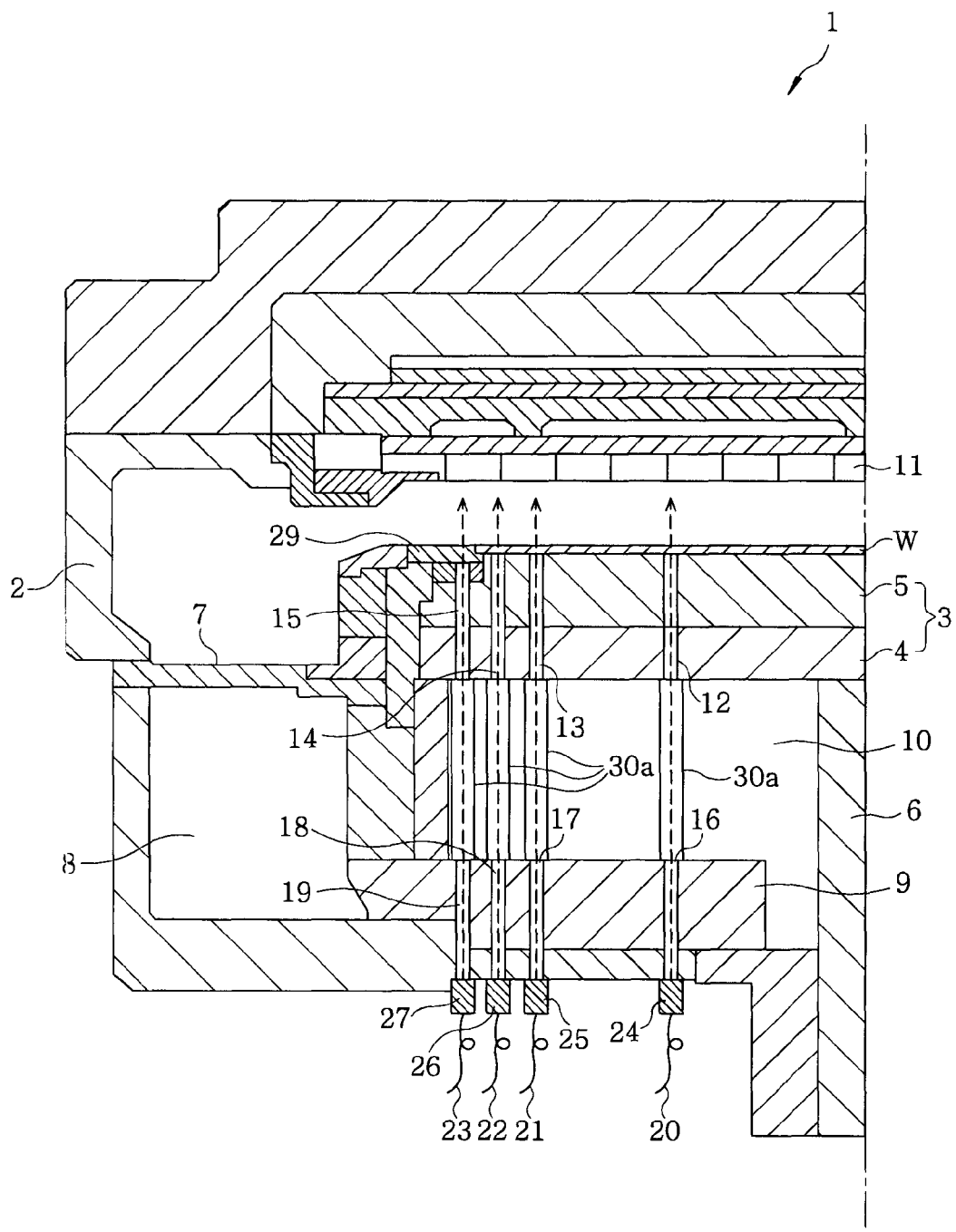
FIG. 7 is a cross sectional view showing a schematic configuration of principal parts of a plasma processing apparatus in accordance with another embodiment of the present invention.

The aforementioned connection member for connecting the base plate 9 and the mounting table 3 (the RF plate 4) is not limited to one having a shape shown in FIG. 1, and may have any shape. Further, as shown in FIG. 7, hollow cylindrical members 30a may be disposed to surround the optical paths of the measurement beams. With this configuration, air flow or the like in the cylindrical members 30a can be suppressed and the optical paths of the measurement beams can be maintained in a good state. Further, the generation of noises caused by the air flow or the like can be suppressed. That is, it is possible to suppress the effect of the air flow to the optical path and, thus, the deterioration of the measurement accuracy due to the atmospheric state in the space gap 10 formed between the RF plate 4 and the base plate 9.

Figure 8:
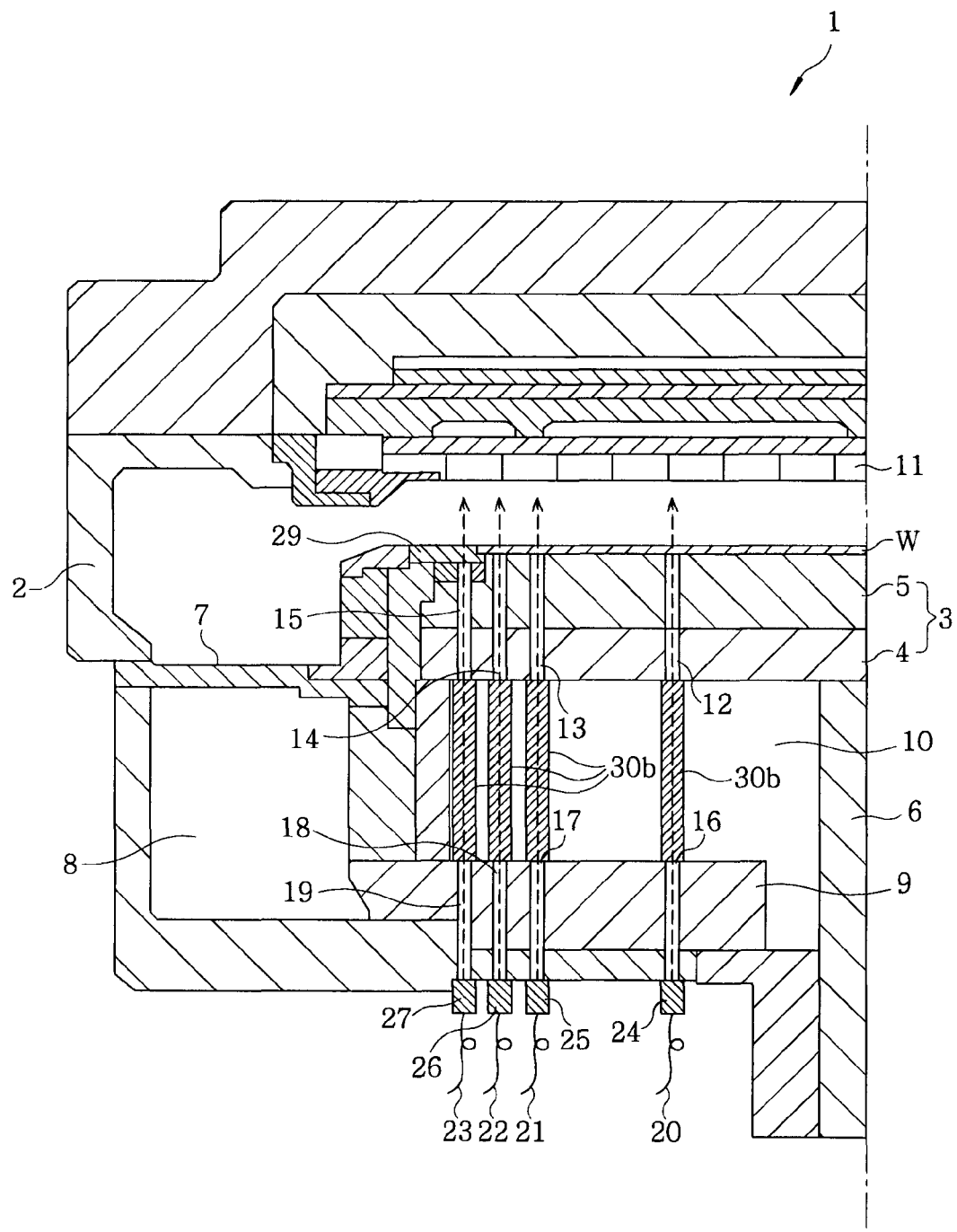
FIG. 8 is a cross sectional view depicting a schematic configuration of principal parts of a plasma processing apparatus in accordance with still another embodiment of the present invention.

In addition, instead of the cylindrical members 30a, it is possible to use columnar rods 30b illustrated in FIG. 8 which are made of a material such as quartz, sapphire or the like and transmit the measurement beams therethrough.

Meanwhile, the RF plate 4 and the electrostatic chuck 5 of the mounting table 3 are generally clamped to each other only at the peripheral portions thereof. Thus, even if the RF plate 4 and the base plate 9 are connected by a connection member, the RF plate 4 and the electrostatic chuck 5 may vibrate or may be bent, such that the RF plate 4 and the electrostatic chuck 5 may be separated from each other.

Figure 9:
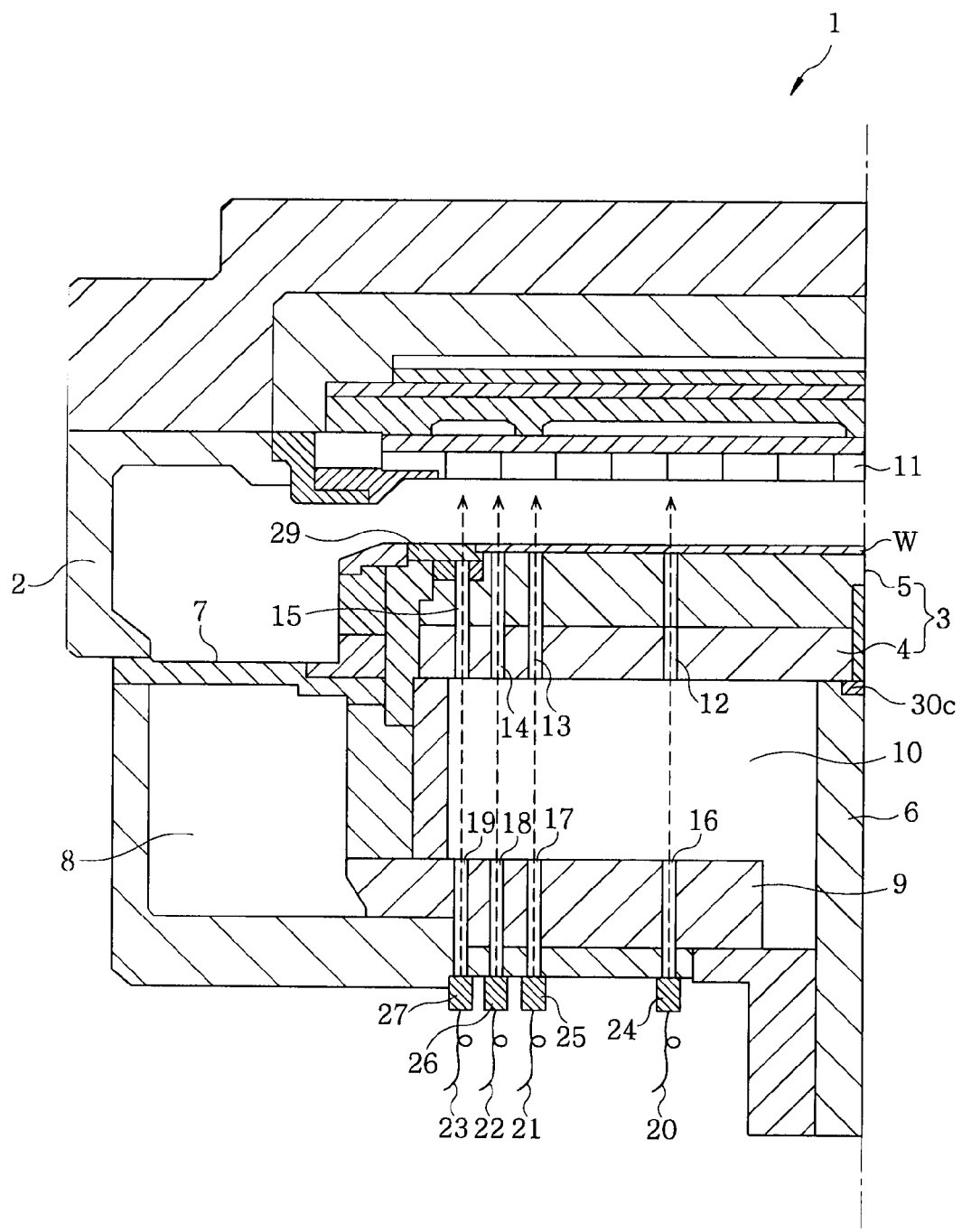
FIG. 9 is a cross sectional view describing a schematic configuration of principal parts of a plasma processing apparatus in accordance with still another embodiment of the present invention.

For that reason, it is preferable to clamp the RF plate 4 and the electrostatic chuck 5 by screws 30c near the central portion where the power feed bar 6 or the like is provided, as can be seen from FIG. 9. Moreover, the power feed bar 6 and the RF plate 4 are clamped to each other by a clamping mechanism (not shown).

Figure 10:
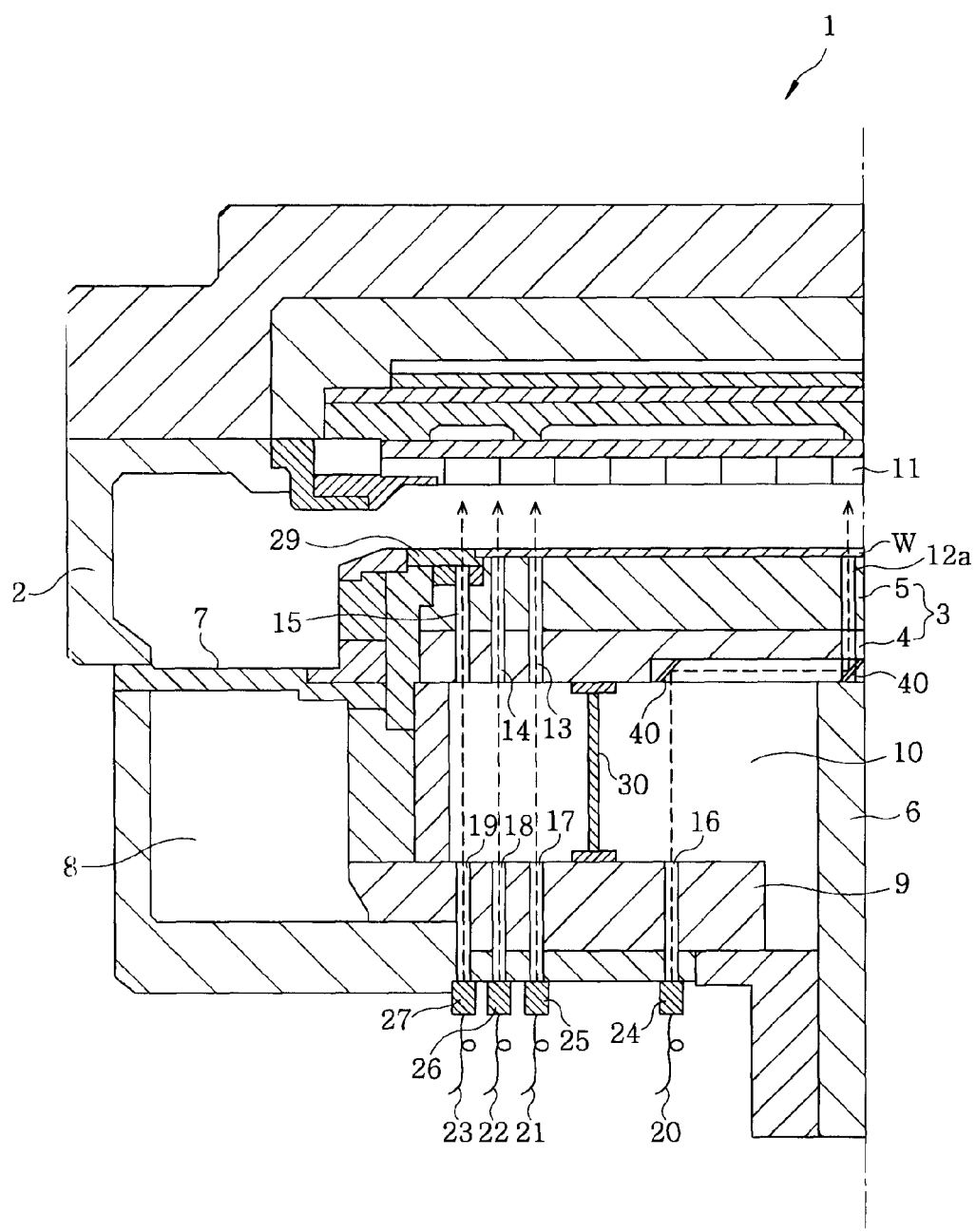
FIG. 10 is a cross sectional view illustrating a schematic configuration of principal parts of a plasma processing apparatus in accordance with still another embodiment of the present invention.

As described above, it is difficult to provide the temperature measuring windows 12 to 15 configured as shown in FIG. 1 at a portion where a structure is provided below the RF plate 4, e.g., at a central portion where the power feed bar 6 is provided. Accordingly, it is difficult to measure a temperature at the central portion of the semiconductor wafer W or the like. In the embodiment of the present invention, it may be arranged in such a way that a temperature measuring window 12a is provided at the central portion above the power feed rod 6 and two mirrors 40 are horizontally arranged on a bottom surface of the RF plate 4 in which one of the mirrors is positioned at the lower end of the temperature measuring window 12a, i.e., at the end of a side contacting with the power feed rod 6 and the other is located at a position facing the through hole 16 adjacent to the power feed rod 6, as shown in FIG. 10.

With this configuration, by using a light beam which transmits through the temperature measuring window 12a via an optical path bent horizontally by two mirrors 40 or the like, the temperature at the central portion of the semiconductor wafer W or the like can be measured.

Figure 11:
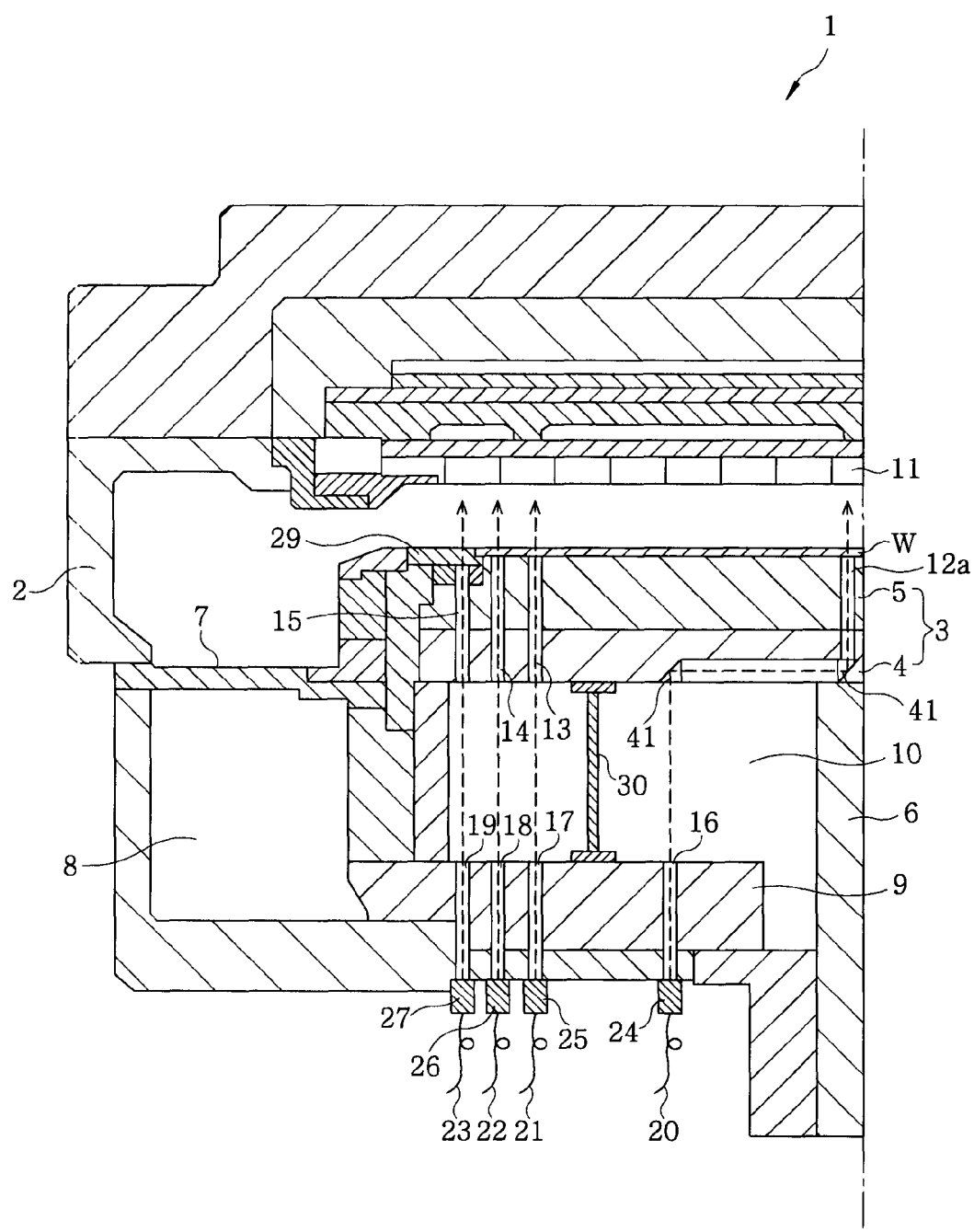
FIG. 11 is a cross sectional view depicting a schematic configuration of principal parts of a plasma processing apparatus in accordance with still another embodiment of the present invention.
Figure 12:
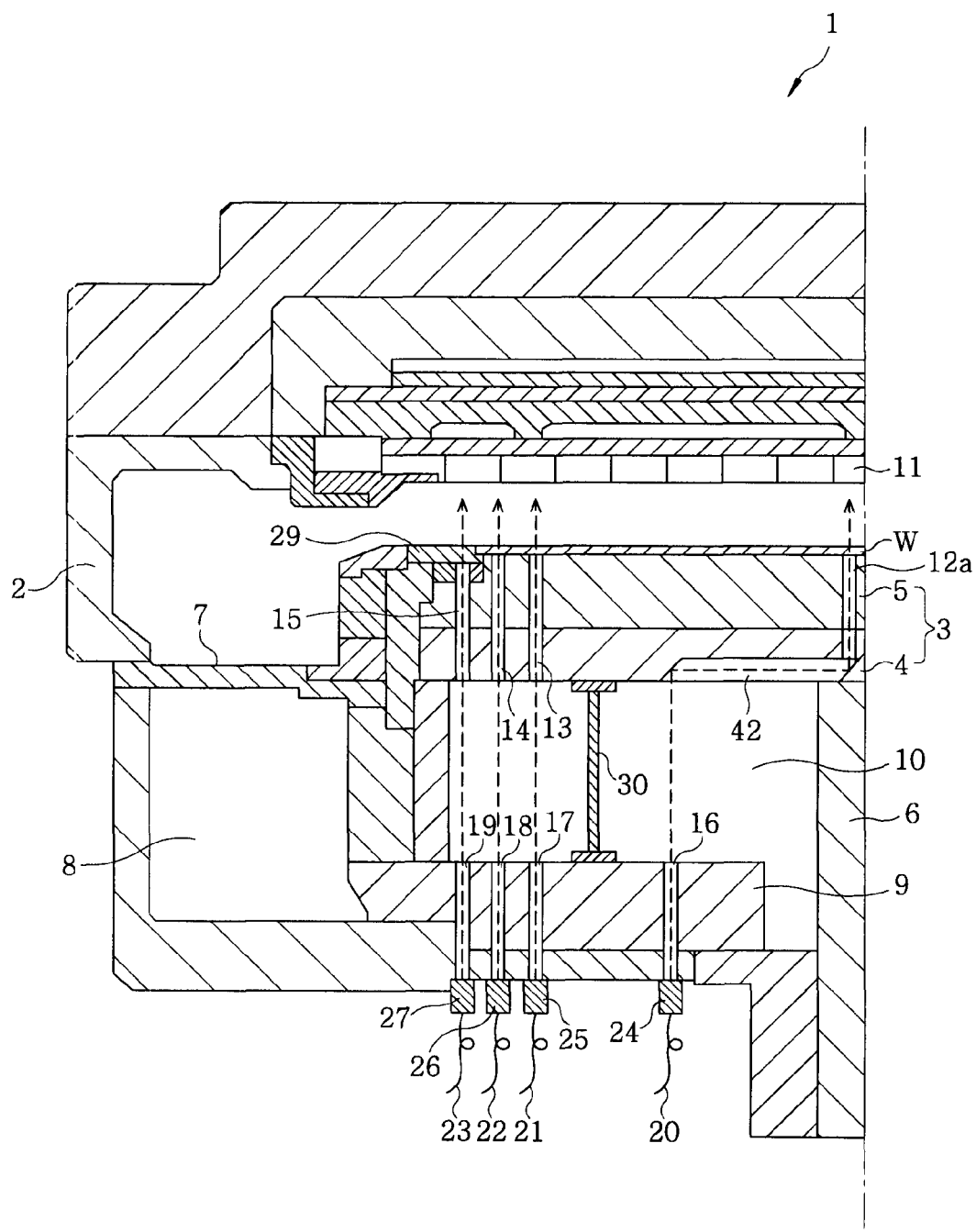
FIG. 12 is a cross sectional view showing a schematic configuration of principal parts of a plasma processing apparatus in accordance with still another embodiment of the present invention.

Instead of the two mirrors 40, there may be used two prisms 41 as shown in FIG. 11 or a singular prism 42 as shown in FIG. 12. Likewise, the temperature at the central portion of the semiconductor wafer W can be measured by using a light beam which is transmitted through the temperature measuring window 12a via an optical path bent horizontally by the two prisms 41 of FIG. 11 or the singular prism 42 of FIG. 12.

This configuration may be applied to, e.g., the case of measuring a temperature at the peripheral portion of the mounting table 3 in which the focus ring 29 is disposed or the case of measuring a temperature of the semiconductor wafer W by irradiating measuring beams from the facing electrode 11 side.

Although the collimators 24 to 27 are fixed to the base plate 9 in the above-described embodiments, the collimators 24 to 27 may also be fixed to the mounting table (the RF plate 4 in FIG. 13) as will be described in the embodiment shown in FIG. 13. With this configuration, the collimators 24 to 27 and the semiconductor wafer W as a temperature measurement target can be positioned closer to each other, and a change in the optical path lengths due to the deformation or the vibration of the mounting table 3 can be further suppressed. In that case, it is possible to prevent the deterioration of the measurement accuracy due to the effect of air flow in the space gap 10 between the RF plate 4 and the base plate 9 to the optical path.

Figure 13:
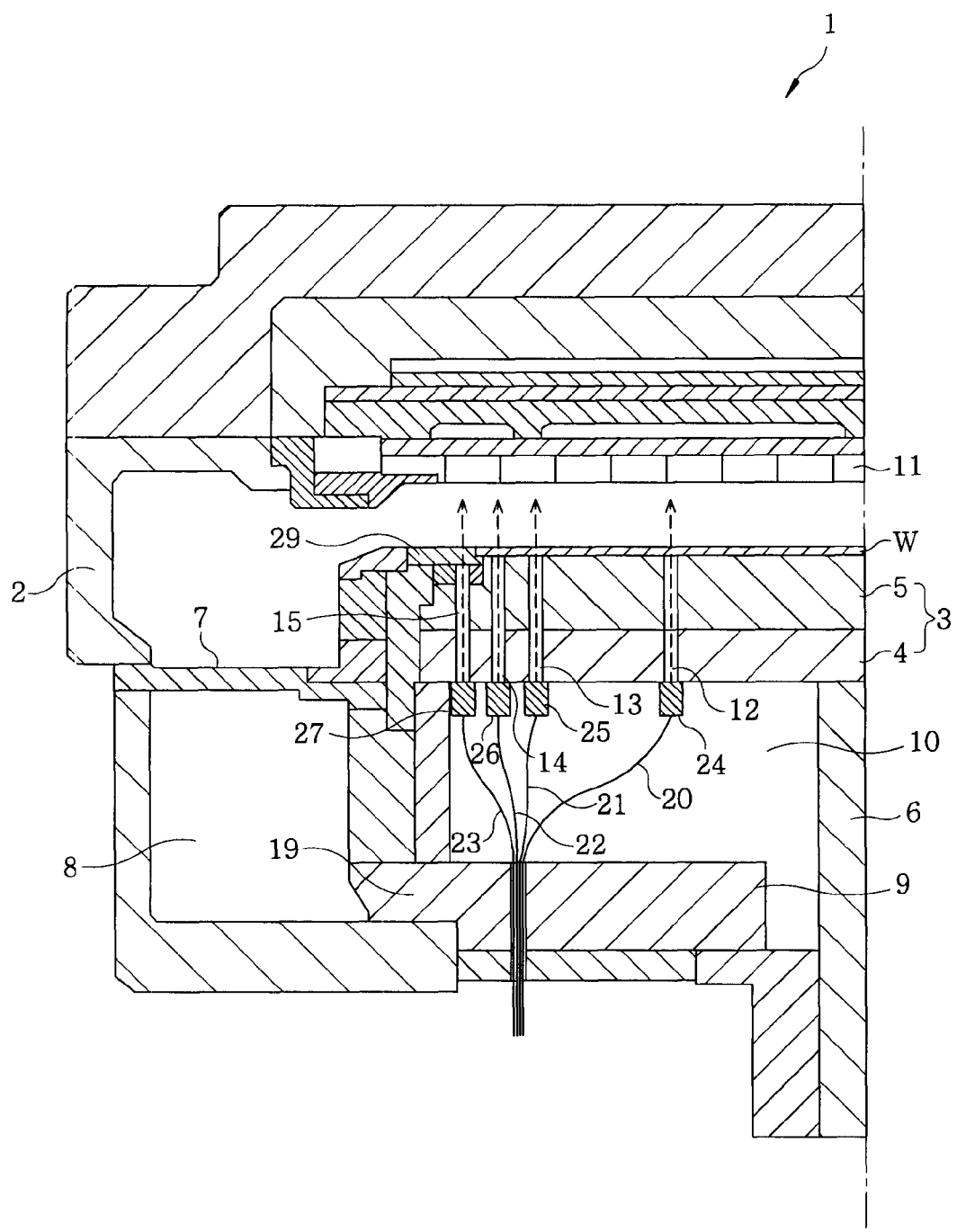
FIG. 13 is a cross sectional view describing a schematic configuration of principal parts of a plasma processing apparatus in accordance with still another embodiment of the present invention.

In addition, although FIG. 13 shows the case where the collimators 24 to 27 are fixed to the RF plate 4, the collimators 24 to 27 may also be fixed to the electrostatic chuck 5. With such configuration, it is possible to further suppress the change in the optical path lengths of the measurement beams due to the deformation or the vibration of the mounting table 3. In that case, however, maintainability such as adjustment of the optical path or the like by the collimators 24 to 27 deteriorates.

Figure 14:
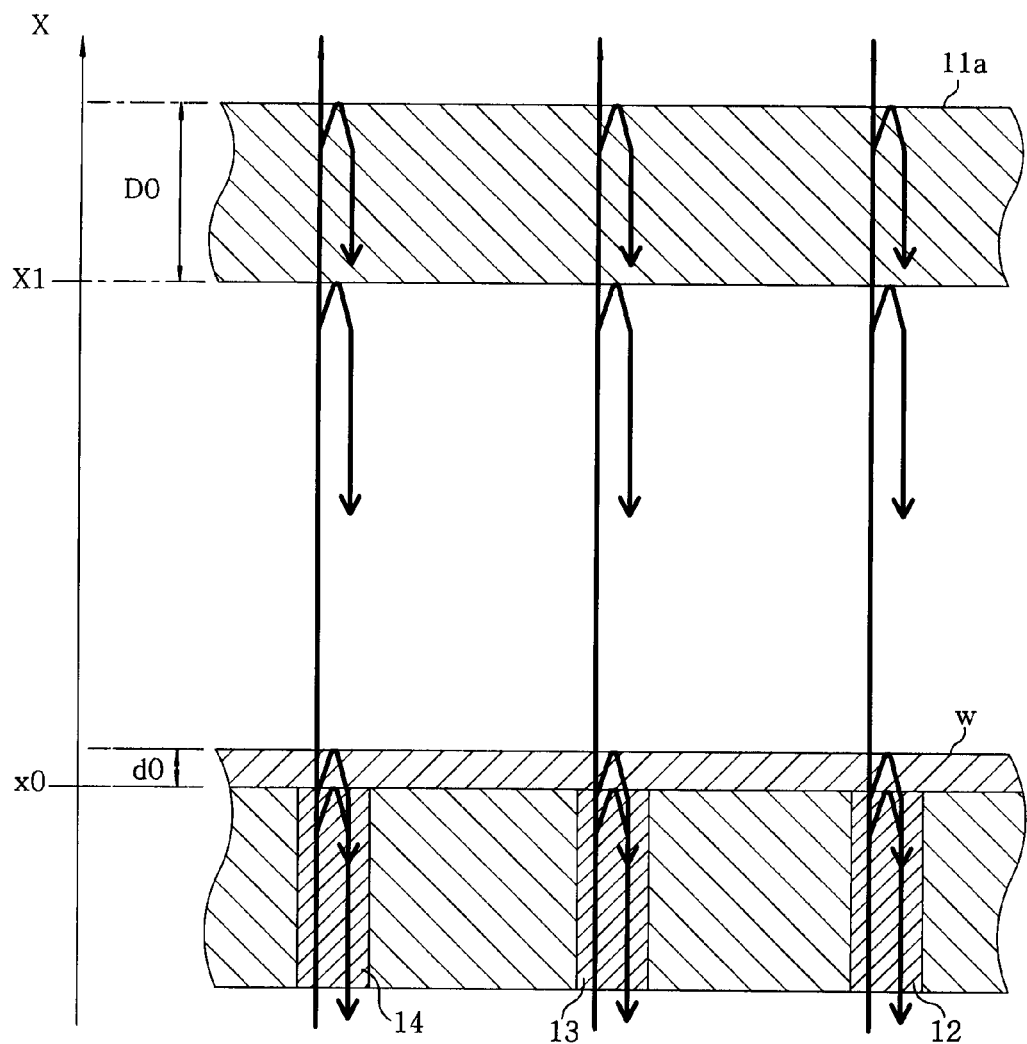
FIG. 14 explains a state of reflection of measurement beams from a cell.

As shown in FIG. 1, the upper electrode 11 is arranged to be located above the mounting table 3 to face the mounting table 3 in the vacuum chamber 2. Further, a cell 11a made of a material, e.g., silicon or the like, which transmits infrared ray may be disposed on the facing surface of the upper electrode 11 to the mounting table 3. A temperature of the cell 11a can be measured by irradiating the measurement beams through the temperature measuring windows 12 to 14 (and the temperature measuring window 15) onto the cell 11a via the semiconductor wafer W (and the focus ring 29) and detecting the reflected beams that are reflected from the top surface and the bottom surface of the cell 11a, as depicted in FIG. 14.

Figure 5B:
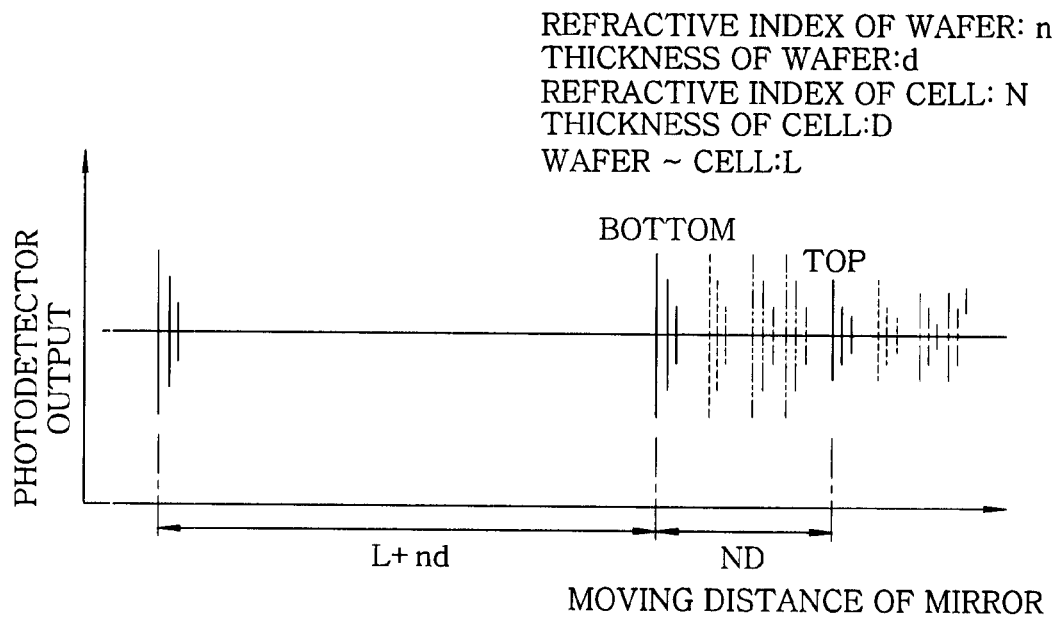

In that case, if the thickness of the semiconductor wafer W is d; the refractive index of the semiconductor wafer W is n; a distance from the semiconductor wafer W to the cell 11a is L; the thickness of the cell 11a is D; and the refractive index of the cell 11a is N, after the interference waveform induced by the reflected measuring beam reflected from the bottom surface of the semiconductor wafer W is detected at each measurement channel, the interference waveform induced by the reflected measuring beam reflected from the bottom surface of the cell 11a is detected at a position spaced apart by a distance corresponding to L+nd, as illustrated in FIG. 5B.

Further, after the interference waveform induced by the reflected measuring beam reflected from the bottom surface of the cell 11a is detected, the interference waveform induced by the reflected measuring beam reflected from the top surface of the cell 11a is detected at a position spaced apart by a distance corresponding to ND. The temperature of the cell 11a can be measured by detecting a change in a distance between the interference waveform induced by the reflected measuring beam reflected from the bottom surface of the cell 11a and the interference waveform induced by the reflected measuring beam reflected from the top surface of the cell 11a.

Figure 15:
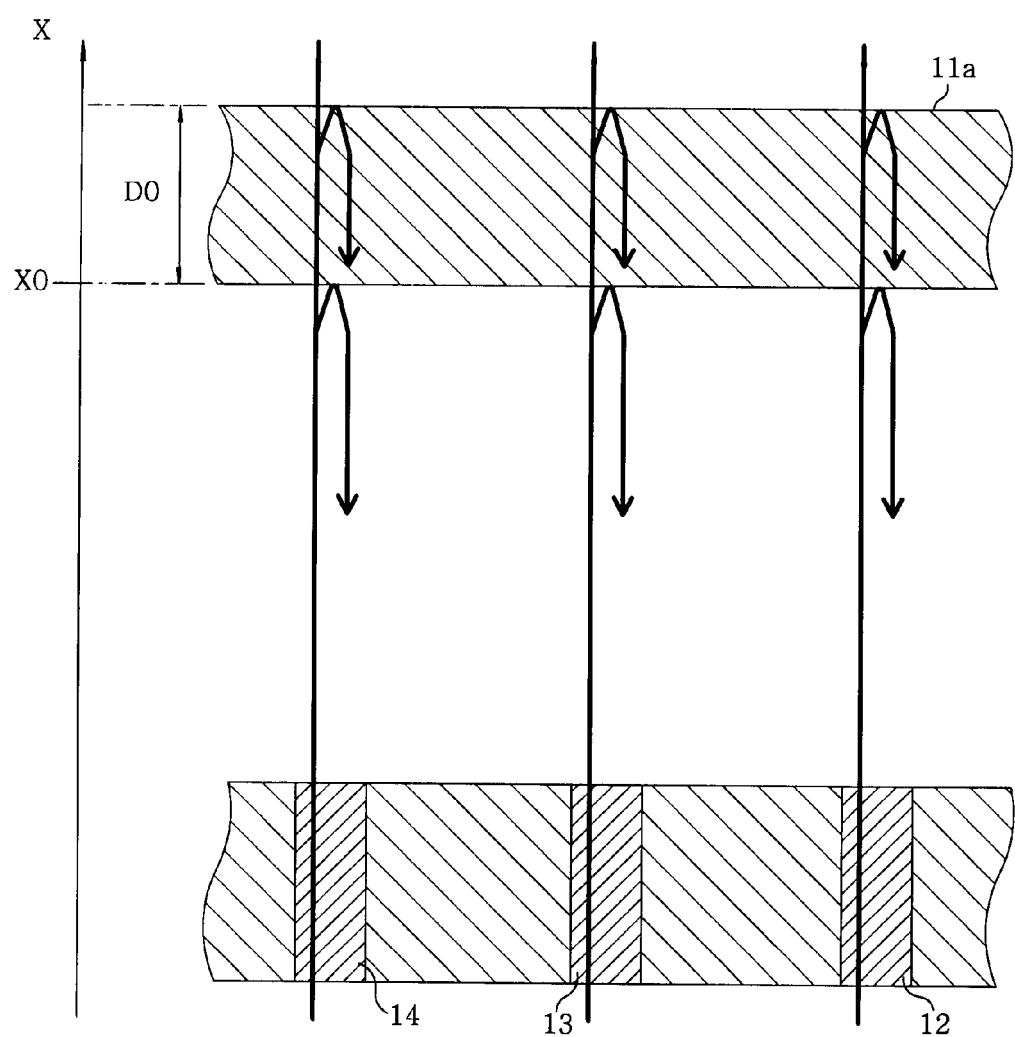
FIG. 15 explains a state of reflection of measurement beams from the cell.
Figure 16A:
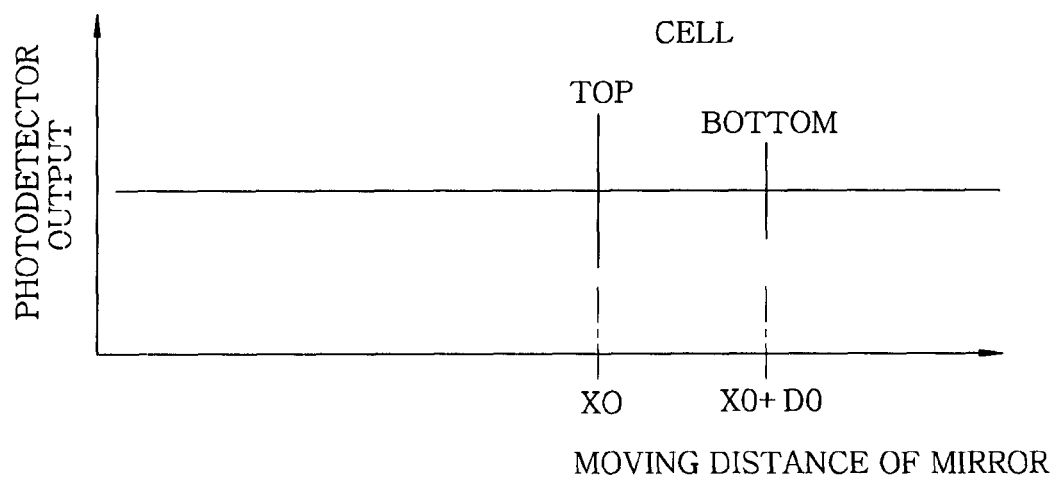
FIGS. 16A and 16B depict exemplary interference waves.
Figure 16B:
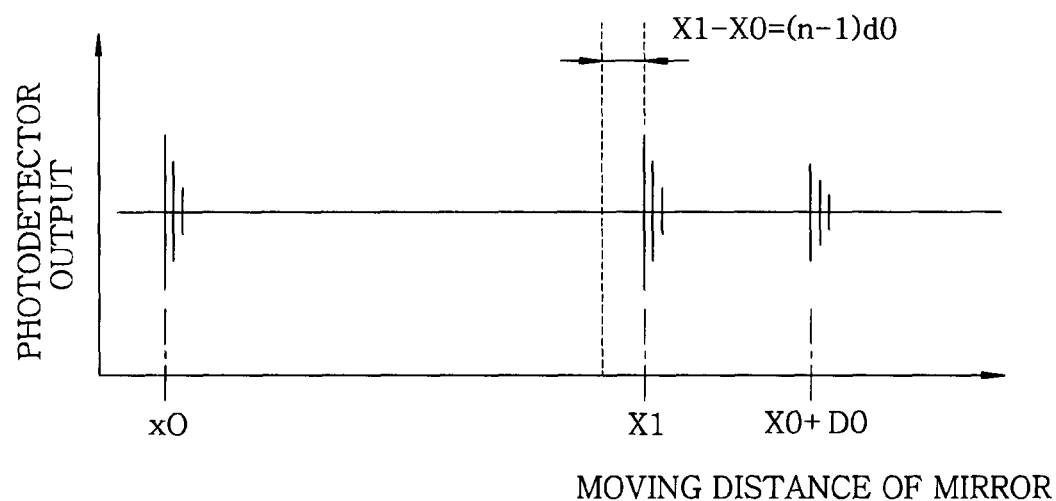

FIG. 15 shows a state of reflection of measurement beams from a cell in the case where the semiconductor wafer W is unloaded from the mounting table 3, and FIGS. 16A and 16B represent the interference waveforms detected by light detecting unit 160 when the semiconductor wafer W is not loaded on the table 3 and when the semiconductor wafer W is loaded on the table 3, respectively. When the semiconductor wafer W is loaded, positions of the interference waves induced by the reflected beams reflected from the cell 11a are shifted by a distance of $(n-1) \cdot d0$ as depicted in FIG. 16B. Therefore, the initial position of the cell 11a needs to be changed when the semiconductor wafer W is loaded on the mounting table 3.

Figure 17:
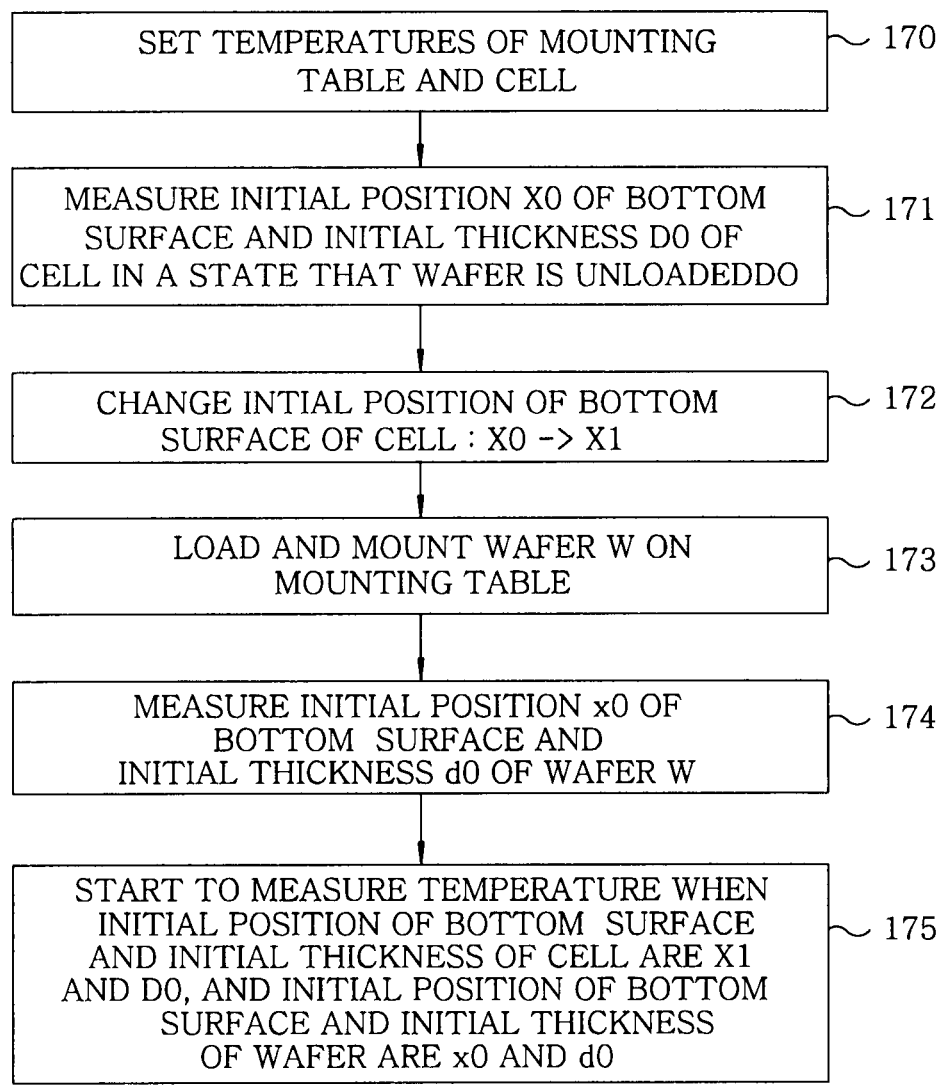
FIG. 17 is a flowchart showing a process for measuring a temperature of the cell.

Hereinafter, a process for measuring a temperature of the cell 11a will be explained. Referring to FIG. 17, first of all, temperatures of the mounting table and the cell are set (step 170). Then, an initial position X0 of the surface and an initial thickness D0 of the cell 11a are measured before the loading of the semiconductor wafer W (step 171).

Thereafter, the initial position of the surface of the cell 11a is set to X1 (step 172).

Next, the semiconductor wafer W is loaded and mounted on the mounting table 3 (step 173) and, then, an initial position x0 of the bottom surface and an initial thickness d0 of the semiconductor wafer W are measured (step 174).

Then, the temperature is measured based on the initial position X1 of the surface of the cell 11a and the initial thickness D0 of the cell 11a, and the initial position x0 of the bottom surface and the initial thickness d0 of the semiconductor wafer W (step 175).

Figure 18A:
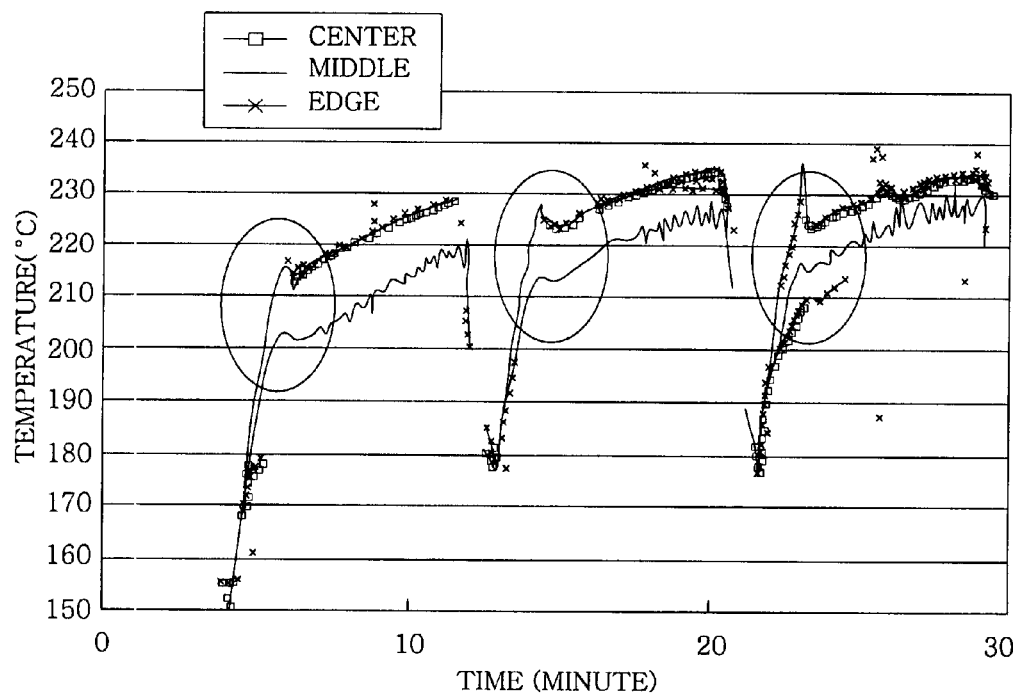
FIGS. 18A and 18B present exemplary results of measuring temperatures of the cell and a focus ring, respectively.
Figure 18B:
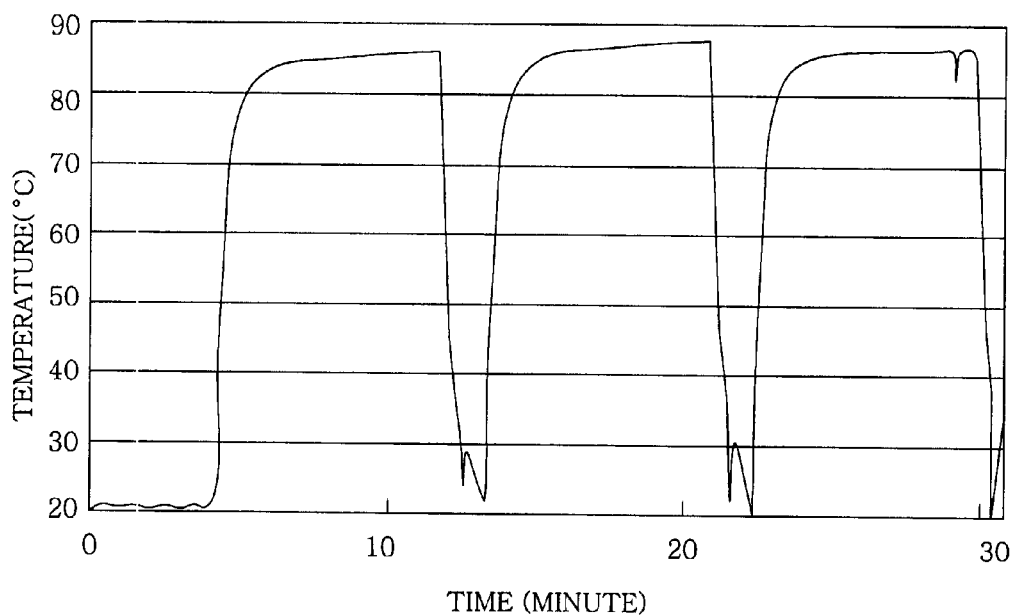

FIGS. 18A and 18B present exemplary results of measuring temperatures of the cell 11a and the focus ring 29, respectively, in which three waveforms represent the results measured by the above-described process when three wafers are sequentially processed by the plasma. As depicted in FIGS. 18A and 18B, the temperature of the cell 11a is higher than or equal to about 220° C., and the temperature of the focus ring 29 ranges from about 80° C. to 90° C.

As the above, since the temperature of the cell 11a or the focus ring 29 as well as that of the semiconductor wafer W can be measured, the plasma processing can be controlled more accurately and finely and, thus, the plasma processing can be performed with high accuracy. In addition, since wear rate of the cell 11a or the focus ring 29 can be monitored simultaneously, the replacement timing of the cell 11a or the focus ring 29 can be predicted, and the plasma processing can be controlled in accordance with the wear rate of the cell 11a or the focus ring 29. Accordingly, the cell 11a or the focus ring 29 can be used for an even longer period of time. As a result, the reduction of the running costs due to an increased life span thereof, the improvement of the productivity due to an improved operation rate of the apparatus and the like can be achieved.

FIGS. 19A to 19H show configurations of modifications of the temperature measuring windows 12 to 15. In the temperature measuring window of FIG. 19A, a protrusion 52b projecting inward is provided at an upper end of the sleeve 52, and a window member 53 is supported by the protrusion 52b. Further, a protective film 57 is formed to cover the top surface of the sleeve 52.

Figure 19A:
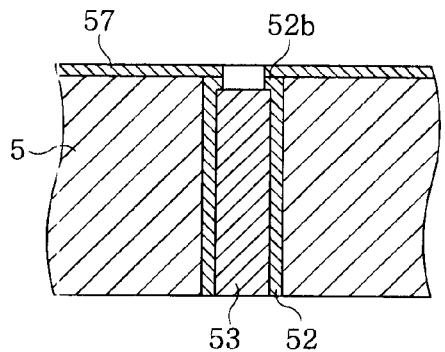
FIGS. 19A to 19H depict configurations of modifications of temperature measuring windows.
Figure 19B:
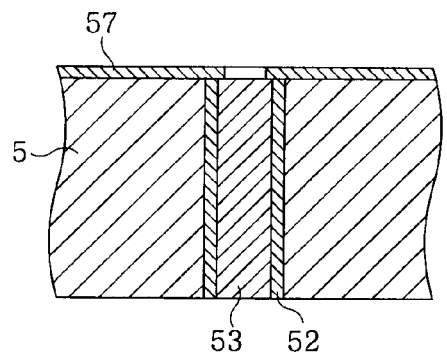
Figure 19C:
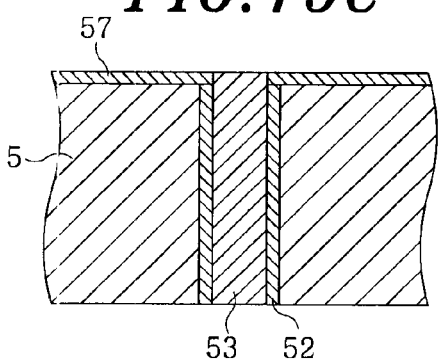

In the temperature measuring window of FIG. 19B, the sleeve 52 is not provided with the protrusion 52b, and an upper peripheral portion of the window member 53 contacts with the protective film 57. In the temperature measuring window of FIG. 19C, the sleeve 52 is not provided with the protrusion 52b, and the protective film 57 does not make a contact with the upper peripheral portion of the window member 53. Moreover, the upper end of the window member 53 extends to a surface of the electrostatic chuck 5.

Figure 19D:
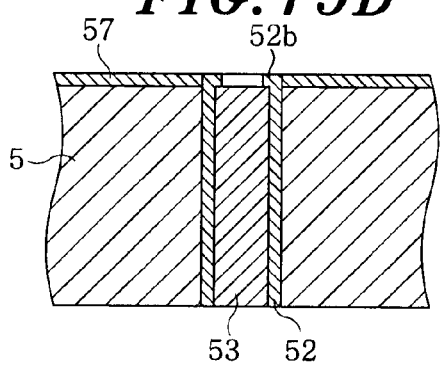
Figure 19E:
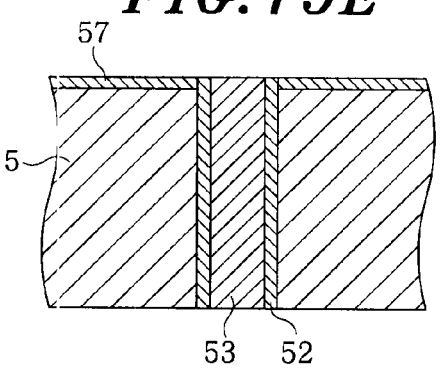

In the temperature measuring window of FIG. 19D, the upper end of the sleeve 52 provided with the protrusion 52b as in the temperature measuring window of FIG. 19A extends to the surface of the electrostatic chuck 5. Further, in the temperature measuring window of FIG. 19E, the sleeve 52 is not provided with the protrusion 52b, as in the temperature measuring window of FIG. 19B, and has an upper end extending to the surface of the electrostatic chuck 5.

Figure 19F:
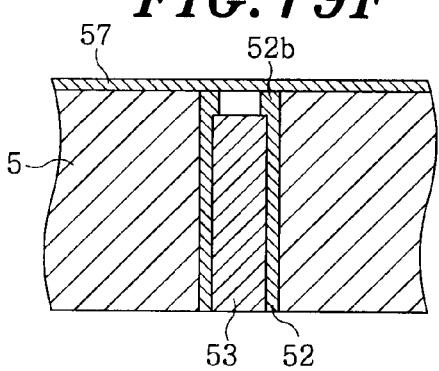
Figure 19G:
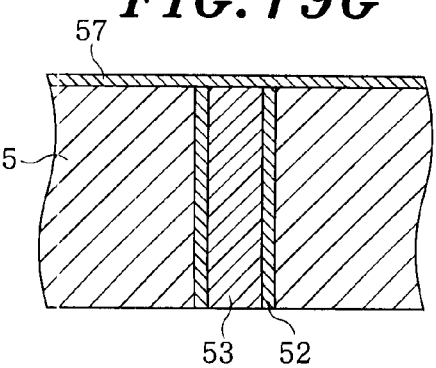

In the temperature measuring window of FIG. 19F, the upper end of the sleeve 52 provided with the protrusion 52b, as in the temperature measuring window of FIG. 19A, is covered by the protective film 67. Further, in the temperature measuring window of FIG. 19G, the sleeve 52 is not provided with the protrusion 52b, as in the temperature measuring window of in FIG. 19B, and the upper ends of the sleeve 52 and the window member 53 are covered by the protective film 57.

Figure 19H:
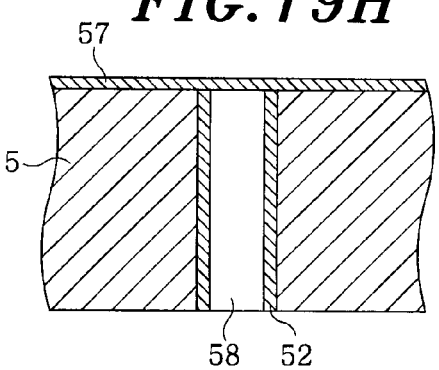

Besides, in the temperature measuring window of FIG. 19H, the sleeve 52 is not provided with the protrusion 52b and the upper end thereof and opening 58 are covered by the protective film 57, as in the temperature measuring window of FIG. 19D, and the window member 53 is not provided inside the sleeve 52. Herein, the vacuum sealing is achieved by the presence of the protective film 57 and the protective film 57 needs to be made of a material having a strength great enough to withstand a pressure difference.

Figure 20A:
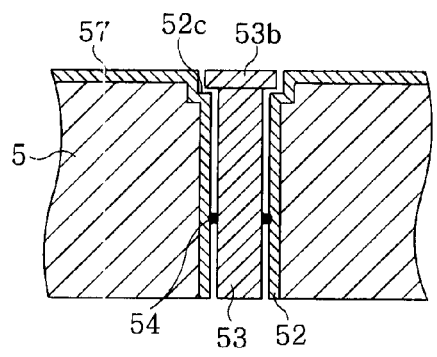
FIGS. 20A and 20B show a configuration of a modification of a temperature measuring window.

The configurations of the temperature measuring windows 12 to 15 are not limited to the above, and may be variously modified. For example, as shown in FIGS. 20A and 20B, there may be employed a configuration in which an end portion 52c having an outwardly increasing diameter is provided at the upper end of the sleeve 52, and the window member 53 having at an upper end thereof an outwardly projecting flange 53a is supported by the contact between the flange 53b and the end portion 52c.

Figure 20B:
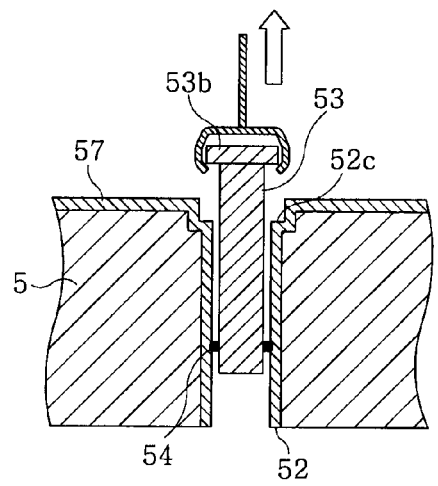

In that case, as shown in FIG. 20B, the window member 53 can be detached from the surface of the electrostatic chuck 5. Accordingly, when the window member 53 is contaminated, damaged or worn, the replacement can be easily carried out. Further, a reference numeral 54 in FIGS. 20A and 20B indicates a vacuum sealing O-ring.

In the above embodiments, there have been described the configuration that the mounting table 3 includes the RF plate 4 made of a conductive material, to which a high frequency power is applied; and the electrostatic chuck 5 provided on the RF plate 4, for attracting and holding the semiconductor wafer W, as shown in FIG. 1 and the like. However, the present invention may be applied to, e.g., the plasma processing apparatus 1 shown in FIG. 21, in which the mounting table 3a is formed as a singular unit of the RF plate 4a and the electrostatic chuck 5a.

Figure 21:
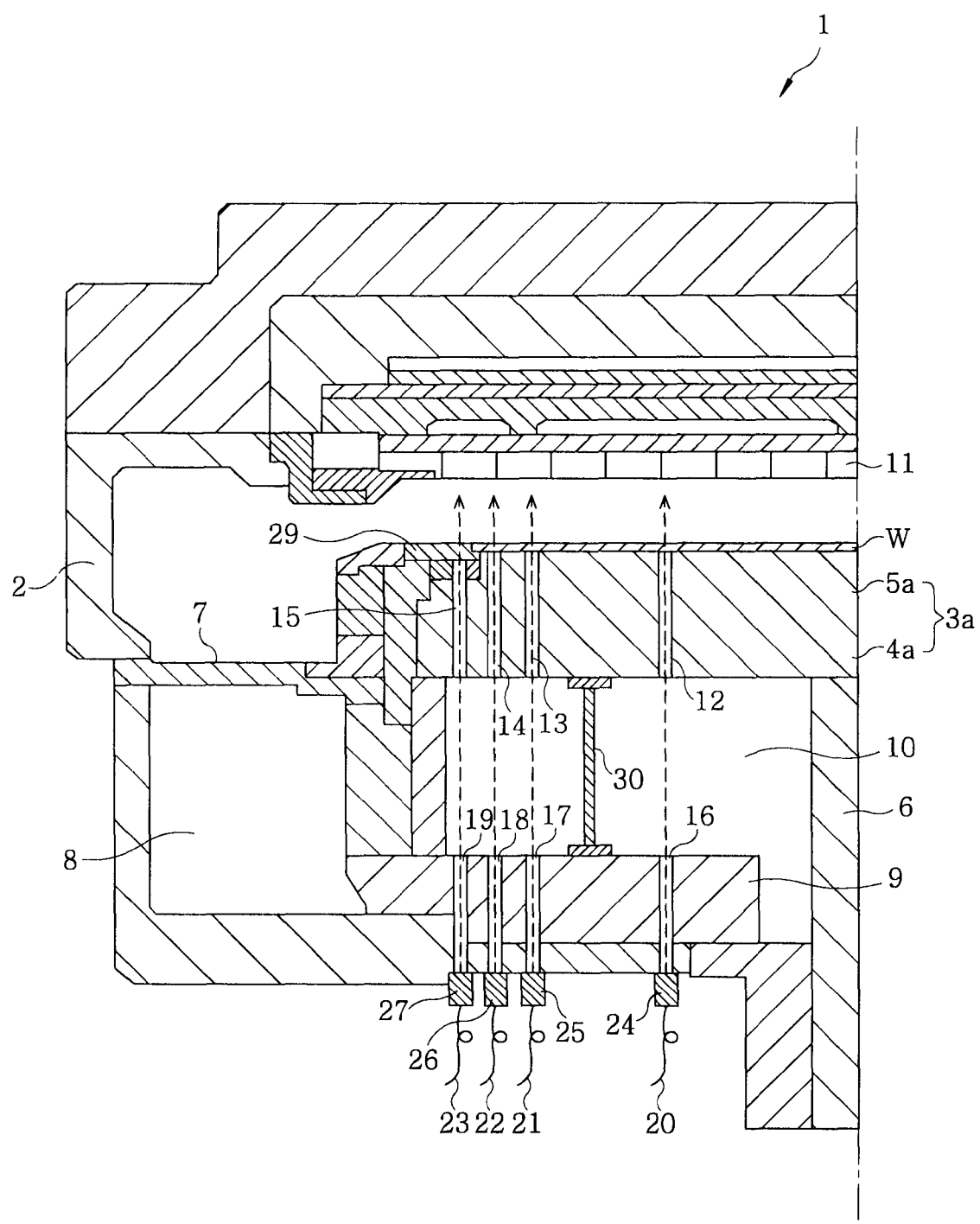
FIG. 21 is a cross sectional view showing a schematic configuration of principal parts of a plasma processing apparatus in accordance with still another embodiment of the present invention.
Figure 22:
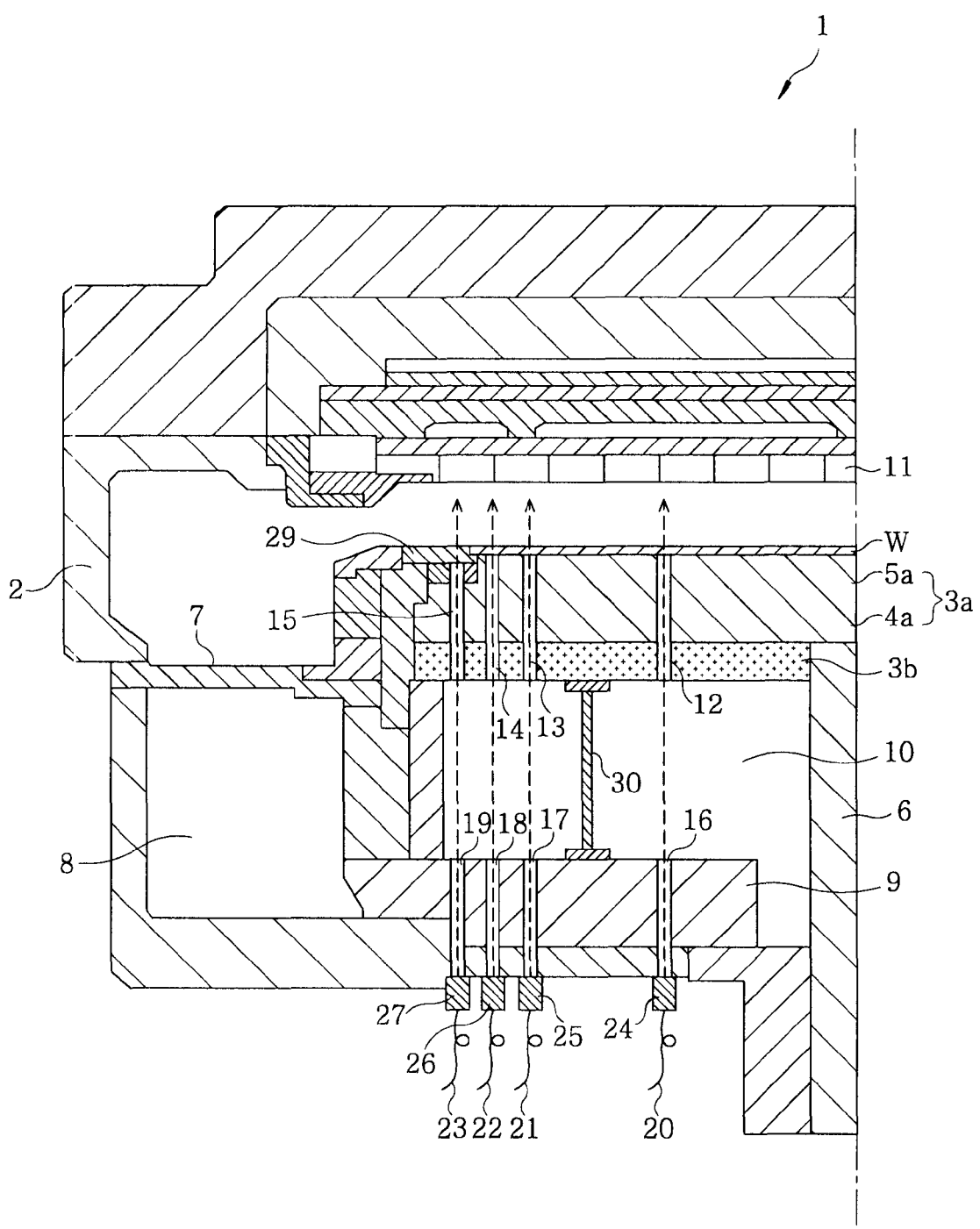
FIG. 22 sets forth a cross sectional view illustrating a schematic configuration of principal parts of a plasma processing apparatus in accordance with still another embodiment of the present invention.

In that case, an insulating member 3b may be provided below a mounting table 3a having the RF plate 4a and the electrostatic chuck 5a which are formed as a unit, e.g., as illustrated in FIG. 22. In FIGS. 21 and 22, like parts are indicated by like reference numerals used in FIG. 1, and redundant description thereof is omitted.

Figure 23:
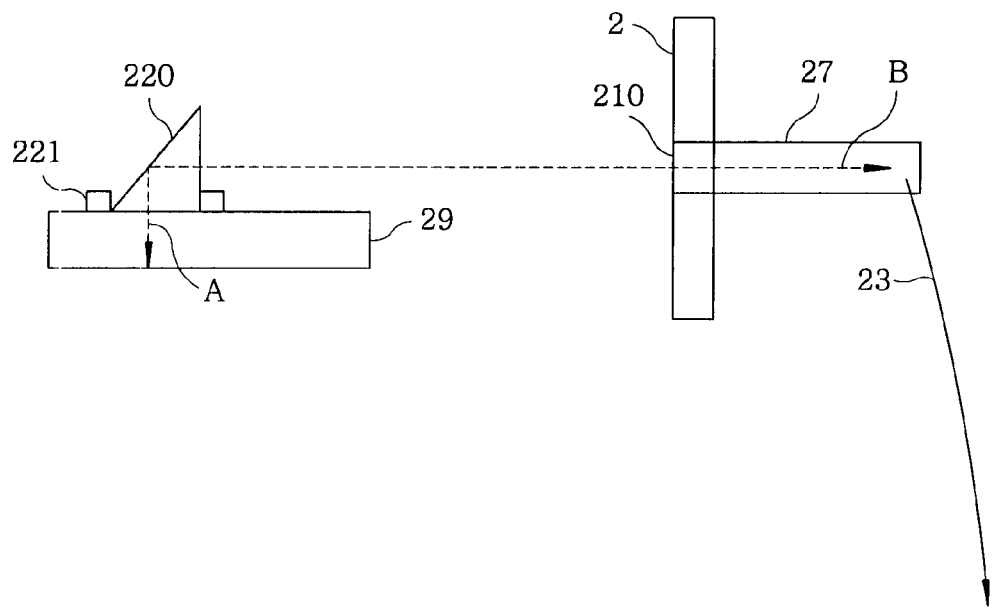
FIG. 23 depicts a schematic configuration of principal parts seen from a side of a plasma processing apparatus in accordance with a modification of the present invention.
Figure 24:
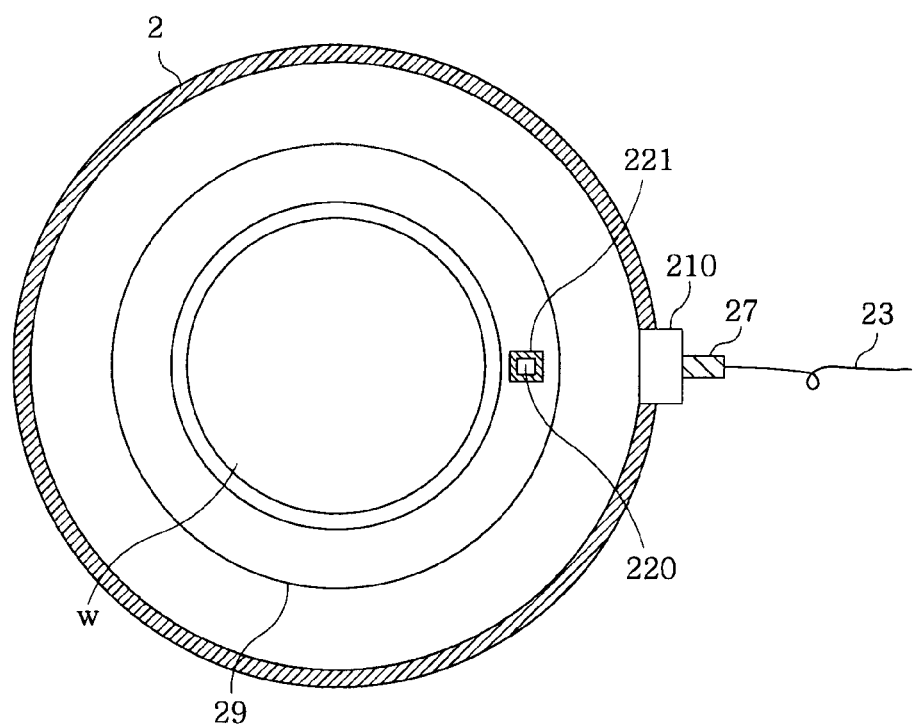
FIG. 24 describes a schematic configuration of principal parts seen from a top of the plasma processing apparatus of FIG. 23.

Hereinafter, a configuration of a modification of the temperature measuring apparatus in accordance with the embodiment of the present invention will be described with reference to FIGS. 23 and 24. FIG. 23 illustrates a schematic configuration of the modification seen from the side, and FIG. 24 shows a schematic configuration of the modification seen from the top. The temperature measuring unit of this modification is configured same as the temperature measuring unit 100 of the above-described embodiments shown in FIG. 3, and performs temperature measurement by using light beam from the light source 110 as described above.

In the modification shown in FIGS. 23 and 24, a window portion (temperature measuring window) 210 which transmits a light beam through the vacuum chamber 2 is formed at the sidewall of the chamber 2. Further, a prism 220 serving as an optical path altering unit is provided on the focus ring 29. The prism 220 is fixed to the focus ring 29 via a frame 221 made of quartz. The prism 220 is preferably installed at a position near the window portion 210 and, more preferably, above the focus ring 29 which is closest to the window portion 210. Moreover, the optical path altering unit is not limited to the prism 220, and may be any optical path altering unit as long as it is capable of effectively altering the optical path of the measurement beam.

Besides, the collimator 27 at which the optical fiber 23 is connected is provided outside the window portion 210. The measurement beam from a light source (not shown) is emitted through the collimator 27 via the optical fiber 23, and enters the vacuum chamber 2 via the window portion 210. Next, the measurement beam is irradiated onto the focus ring 29 along its optical path altered downward in an approximately right angle by the prism 220, as indicated by an arrow A in FIG. 23.

Thereafter, the measurement beam reflected from the focus ring 29 returns to the window portion 210 along the optical path altered horizontally in an approximately right angle by the prism 220, and then enters the collimator 27, as indicated by an arrow B in FIG. 23. Next, the measurement beam is sent from the collimator 27 to a light detecting unit (not shown) of a temperature detection unit via the optical fiber 23, thereby measuring the temperature as in the aforementioned embodiments.

With this configuration, the measurement beam does not pass through the atmospheric atmosphere, so that it is possible to prevent the deterioration of the measurement accuracy due to the effect of an air flow to the optical path. Further, the large scaled machining of the mounting table 3 is not required unlike in the above-described embodiments. Moreover, instead of providing the window portion 210 at the vacuum chamber 2, a window for detecting a stopping point of etching or the like may be used and, accordingly, the temperature of the focus ring 29 can be measured with a simple configuration.

Besides, the temperature of the focus ring 29 may be measured at multiple locations by providing a plurality of prisms 220 or the like. In that case, a plurality of pairs of the optical fiber 23 and the collimator 27 are provided outside a single window portion 210, and the measurement beans are irradiated onto the prisms 220 while varying irradiation angles. Further, two window portions 210 may be provided at two locations spaced apart from each other by, e.g., about 180° to measure the temperature of the portions of the focus ring 29 which are spaced apart from each other by about 180°.

In the above embodiments shown in FIG. 1 and the like, the temperature of the semiconductor wafer W is measured at three points, and that of the focus ring 29 is measured at a single point. However, only the temperature of the focus ring 29 may be measured in the manner described in the modification. Besides, in the modification, it is needed to provide the optical path altering unit such as the prism 220 or the like on the focus ring 29. For that reason, the modification is mainly applied to, e.g., the test performed before the manufacture of the product, than to the temperature measurement during the plasma processing in which the product is being manufactured.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
a vacuum chamber in which a substrate is to be accommodated and processed by a plasma;
a mounting table provided in the vacuum chamber for mounting the substrate thereon, the mounting table including an RF plate made of an electrically conductive material;
a base plate provided below the mounting table and having a space therebetween;
a temperature measuring unit including: a light source,
a splitter for dividing a light beam from the light source into a measurement beam and a reference beam,
a reference beam reflector for reflecting the reference beam from the splitter,
an optical path length altering unit for altering an optical path length of the reference beam reflected from the reference beam reflector,
an optical fiber for irradiating the measurement beam onto the substrate, a collimator provided at an outlet of the optical fiber, and
a light detecting unit for detecting an interference between the measurement beam reflected from the substrate and the reference beam reflected from the reference beam reflector;
an airtightly sealed temperature measuring window provided in the mounting table for optically communicating a top surface and a bottom surface of the mounting table to transmit the measurement beam therethrough;
a plurality of connection members connecting the mounting table and the base plate, the connection members being provided inside the space between the mounting table and the base plate; and a power feed bar connected to a central portion of the RF plate and to which a high frequency power is applied to supply the high frequency power to the RF plate,
wherein a space above the mounting table is set to be maintained under a vacuum atmosphere, and the space between the mounting table and the base plate is set to be maintained under a normal pressure atmosphere,
wherein the collimator is fixed to the base plate at a position corresponding to the temperature measuring window, thereby measuring a temperature of the substrate via the temperature measuring window by the temperature measuring unit,
wherein the plasma processing apparatus further comprises a prism located at the mounting table and configured to bend an optical path of the measurement beam to a horizontal path and to a vertical path to irradiate the measurement beam onto the substrate to enable a temperature at a central portion of the substrate that is above the power feed bar to be measured,
wherein the temperature measuring unit is configured to measure at least two portions of the substrate along a radial direction of the substrate, and said at least two portions of the substrate includes the central portion of the substrate,
wherein the vacuum chamber has therein a facing electrode facing the mounting table and a cell located on the facing surface of the facing electrode and made of silicon which transmits an infrared ray therethrough such that measurement beams emitted from the mounting table are reflected from a top surface and a bottom surface of the cell, and wherein the temperature measuring unit measures a temperature of the cell based on reflected measurement beams from the top surface and the bottom surface of the cell via the substrate on the mounting table and the temperature measuring window.

2. The plasma processing apparatus of claim 1, wherein the mounting table includes an electrostatic chuck provided on the RF plate, for attracting and holding the substrate.

3. The plasma processing apparatus of claim 1, wherein the temperature measuring unit further includes a second splitter for dividing the measurement beam from the splitter into a first to an nth measurement beams, thereby measuring temperatures at a plurality of points by using a plurality of measurement beams from the second splitter.

4. The plasma processing apparatus of claim 1, wherein the prism is configured to change the optical path of the measurement beam from a horizontal direction to an upward direction going toward the substrate.

5. The plasma processing apparatus of claim 4, wherein the mounting table includes a chuck that is located between the prism and the substrate.

6. The plasma processing apparatus of claim 1, wherein the temperature measuring unit measures the temperature of the facing electrode based on a change between an interference waveform induced by a reflected measurement beam from a bottom surface of the facing electrode and an interference waveform induced by a reflected measurement beam from a top surface of the facing electrode.

7. The plasma processing apparatus of claim 1, wherein the temperature measuring window is detachable from the mounting table.

8. The plasma processing apparatus of claim 1, wherein the central portion of the substrate is located directly above the power feed bar and the prism is arranged for measuring the temperature of the central portion located directly above the power feed bar.

9. The plasma processing apparatus according to claim 1, further comprising: a focus ring installed on the mounting table; a sidewall window formed on a sidewall of the plasma processing apparatus; and
a prism fixed on the focus ring and configured to bend an optical path of a measurement beam emitted from the temperature measuring unit through the sidewall window, wherein the temperature measuring unit measures a temperature of the focus ring based on a reflection of the measurement beam from a surface of the focus ring through the prism and through the sidewall window.

* * * * *

UNITED STATES PATENT AND TRADEMARK OFFICE
CERTIFICATE OF CORRECTION

PATENT NO.        : 8,986,494 B2
APPLICATION NO.   : 12/698616
DATED             : March 24, 2015
INVENTOR(S)       : Tatsuo Matsudo et al.

It is certified that error appears in the above-identified patent and that said Letters Patent is hereby corrected as shown below:

Title page, item (75) Inventors: the second inventor's name:
change "Chishlo Koshimizu" to --Chishio Koshimizu--.

Signed and Sealed this
Twenty-fourth Day of November, 2015

Michelle K. Lee
*Director of the United States Patent and Trademark Office*